(12) United States Patent
Funk et al.

(10) Patent No.: US 8,343,371 B2
(45) Date of Patent: Jan. 1, 2013

(54) APPARATUS AND METHOD FOR IMPROVING PHOTORESIST PROPERTIES USING A QUASI-NEUTRAL BEAM

(75) Inventors: Merritt Funk, Austin, TX (US); Lee Chen, Cedar Creek, TX (US); Radha Sundararajan, Dripping Springs, TX (US)

(73) Assignee: Tokyo Electron Limited (JP)

( * ) Notice: Subject to any disclaimer, the term of this patent is extended or adjusted under 35 U.S.C. 154(b) by 545 days.

(21) Appl. No.: 12/688,755

(22) Filed: Jan. 15, 2010

(65) Prior Publication Data

US 2011/0174606 A1  Jul. 21, 2011

(51) Int. Cl.
*G01L 21/30* (2006.01)
(52) U.S. Cl. ............. 216/59; 216/66; 216/67; 216/71
(58) Field of Classification Search .......... 216/59, 216/66, 67, 71
See application file for complete search history.

(56) References Cited

U.S. PATENT DOCUMENTS

| | | | |
|---|---|---|---|
| 5,350,480 A | 9/1994 | Gray | |
| 5,468,955 A | 11/1995 | Chen et al. | |
| 5,571,366 A * | 11/1996 | Ishii et al. | 156/345.26 |
| 5,593,741 A * | 1/1997 | Ikeda | 427/579 |
| 5,883,005 A | 3/1999 | Minton et al. | |
| 6,220,201 B1 * | 4/2001 | Nowak et al. | 118/723 I |
| 7,094,702 B2 | 8/2006 | Yeom et al. | |
| 2002/0060201 A1 | 5/2002 | Yeom et al. | |
| 2003/0098291 A1 | 5/2003 | Yeom et al. | |
| 2003/0209519 A1 | 11/2003 | Yeom et al. | |
| 2005/0136604 A1 * | 6/2005 | Al-Bayati et al. | 438/301 |
| 2006/0066247 A1 | 3/2006 | Koshiishi et al. | |
| 2006/0102286 A1 * | 5/2006 | Kim | 156/345.35 |
| 2007/0069118 A1 | 3/2007 | Economou et al. | |

* cited by examiner

*Primary Examiner* — Binh X Tran

(57) ABSTRACT

The invention can provide apparatus and methods of processing a substrate in real-time using a Quasi-Neutral Beam (Q-NB) curing system to improve the etch resistance of photoresist layer. In addition, the improved photoresist layer can be used to more accurately control gate and/or spacer critical dimensions (CDs), to control gate and/or spacer CD uniformity, and to eliminate line edge roughness (LER) and line width roughness (LWR).

2 Claims, 8 Drawing Sheets

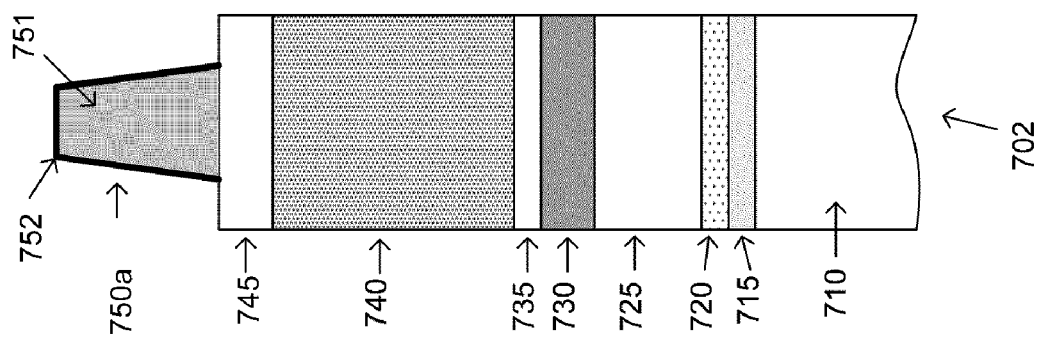
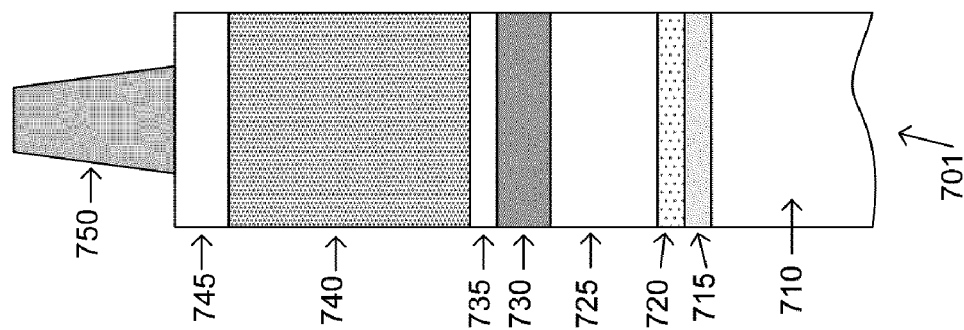

APPARATUS AND METHOD FOR IMPROVING PHOTORESIST PROPERTIES USING A QUASI-NEUTRAL BEAM

BACKGROUND OF THE INVENTION

1. Field of the Invention

The present invention relates to substrate processing, and more particularly to improving the substrate processing using radiation-sensitive material (photoresist) curing and/or hardening procedures, and subsystems.

2. Description of the Related Art

During semiconductor processing, plasma is often utilized to assist etch processes by facilitating the anisotropic removal of material along fine lines or within vias (or contacts) patterned on a semiconductor substrate. Furthermore, plasma is utilized to enhance the deposition of thin films by providing improved mobility of adatoms on a semiconductor substrate.

Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k dielectric materials, poly-silicon, and silicon nitride.

However, the use of plasma (i.e., electrically charged particles), itself, produces problems in the manufacture of semiconductor devices. As devices have become smaller and integration densities have increased, breakdown voltages of insulation and isolation structures therein have, in many instances, been markedly reduced, often to much less than ten volts. For example, some integrated circuit (IC) device designs call for insulators of sub-micron thicknesses.

At the same time, the reduction of the size of structures reduces the capacitance value of the insulation or isolation structures, and relatively fewer charged particles are required to develop an electric field of sufficient strength to break down insulation or isolation structures. Therefore, the tolerance of semiconductor structures for the charge carried by particles impinging on them during the manufacturing process, such as a dry plasma etching process, has become quite limited and the structures for dissipating such charges during manufacture are sometimes required, often complicating the design of the semiconductor device.

While this problem could be avoided by performing processing with neutrally charged particles, the charge of an ion or electron is the only property by which the motion of these particles can be effectively manipulated and guided. Therefore, an ion must remain in a charged state until its trajectory can be established and the energy of the ion must be sufficient that its trajectory will remain unchanged when neutralized by an electron. Even then, the trajectory may be altered and the flux of a neutral beam can be severely depleted by collisions with other particles which may or may not have been neutralized and which may have trajectories that are not precisely parallel. As a result of this need, neutral beam sources have been developed to produce a beam of neutrally charged particles of arbitrary energy that may be as low as a few electron volts and as large as tens of thousands of electron volts or larger.

SUMMARY OF THE INVENTION

The invention relates to a method and system for treating a substrate and, more particularly, to an apparatus and method for improving the properties of an un-patterned and/or a patterned radiation-sensitive material (photoresist) layer using a Quasi-Neutral Beam (Q-NB) curing system.

Furthermore, the invention relates to a Q-NB curing system and methods for curing and/or hardening an un-patterned and/or a patterned radiation-sensitive material (photoresist) layer on a substrate with a space-charge neutralized quasi-neutral beam activated curing and/or hardening process. The Q-NB curing system comprises a first plasma chamber for forming a first plasma at a first plasma potential, and a curing (hardening) plasma chamber for forming a curing (hardening) plasma at a curing (hardening) plasma potential greater than the first plasma potential, wherein the curing (hardening) plasma is formed using electron flux from the first plasma. Further, the Q-NB curing (hardening) system comprises a substrate holder configured to position a substrate in the curing (hardening) plasma chamber.

The invention can include a Q-NB curing (hardening) system that comprises: a plasma generation chamber comprising a first plasma region configured to receive a first process gas at a first pressure; curing (hardening) chamber comprising a curing (hardening) plasma region disposed downstream of the first plasma region and configured to receive the first process gas from the first plasma region at a second pressure; a first gas injection system coupled to the plasma generation chamber and configured to introduce the first process gas to the first plasma region; a plasma generation system coupled to the plasma generation chamber and configured to generate a first plasma at a first plasma potential in the first plasma region from the first process gas; a separation member disposed between the first plasma region and the curing (hardening) plasma region, wherein the separation member comprises one or more openings configured to allow an electron flux from the first plasma region to the curing (hardening) plasma region to form a curing (hardening) plasma at a curing (hardening) plasma potential; a bias electrode system coupled to the curing (hardening) chamber and configured to elevate the curing (hardening) plasma potential above the first plasma potential in order to control the electron flux; a substrate holder coupled to the curing (hardening) chamber and configured to support the substrate proximate the curing (hardening) plasma region; and a vacuum pumping system coupled to the curing (hardening) chamber and configured to pump the curing (hardening) plasma region in the curing (hardening) chamber.

When electrons are fed from the first plasma region to the second plasma region and heated in the second plasma region, the second pressure may be low relative to the first pressure in the first plasma region. For example, the first pressure may be approximately an order of magnitude larger than the second pressure. Additionally, for example, the first pressure may be selected for ease of plasma ignition and for efficient generation of plasma, while the second pressure is selected to be relatively low in order to reduce or minimize collisions in the second plasma region.

According to another embodiment, a method for curing and/or hardening an un-patterned and/or a patterned radiation-sensitive material (photoresist) layer on a substrate is described that comprises: disposing the substrate in a curing (hardening) chamber configured to cure and/or to harden an un-patterned and/or a patterned radiation-sensitive material (photoresist) layer; forming a first plasma in a first plasma region at a first plasma potential; forming a curing (hardening) plasma in a curing (hardening) plasma region at a curing (hardening) plasma potential using electron flux from the first plasma region; elevating the curing (hardening) plasma potential above the first plasma potential to control the electron flux; controlling a pressure in the curing (hardening) chamber; and exposing the substrate to the curing (hardening) plasma.

The invention can provide apparatus and methods of processing a substrate in real-time using subsystems and processing sequences created to cure and/or harden radiation-sensitive materials. In addition, the hardened radiation-sensitive layer can be used to more accurately control gate and/or spacer critical dimensions (CDs), to control gate and/or spacer CD uniformity, and to eliminate line edge roughness (LER) and line width roughness (LWR).

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 illustrates an exemplary view of a first Q-NB curing (hardening) procedure using a metal gate structure in accordance with embodiments of the invention.

DETAILED DESCRIPTION

The invention provides apparatus and methods of processing a substrate in real-time using subsystems and processing sequences created to cure and/or harden radiation-sensitive materials. In addition, the cured and/or hardened radiation-sensitive material layer can be used to more accurately control gate and/or spacer critical dimensions (CDs), to control gate and/or spacer CD uniformity, and to eliminate and/or reduce line edge roughness (LER) and line width roughness (LWR).

In some embodiments, apparatus and methods are provided for creating and/or using a metrology library that includes profile data and diffraction signal data for cured and/or hardened radiation-sensitive material (photoresist) features and periodic structures.

One or more evaluation features can be provided at various locations on a substrate and can be used to evaluate and/or verify Q-NB curing (hardening) procedures and associated models. Substrates can have real-time and historical data associated with them, and the substrate data can include Q-NB curing and/or hardening data. In addition, the substrate can have other data associated with them, and the other data can include gate structure data, the number of required sites, the number of visited sites, confidence data and/or risk data for one or more of the sites, site ranking data, transferring sequence data, or process-related data, or evaluation/verification-related data, or any combination thereof. The data associated with substrates can include transfer sequence data that can be used to establish when and where to transfer the substrates, and transfer sequences can be changed using operational state data.

During radiation-sensitive material (photoresist) hardening and/or etching, a dry plasma process can be utilized, and the plasma is formed from a process gas by coupling electromagnetic (EM) energy, such as radio frequency (RF) power, to the process gas in order to heat electrons and cause subsequent ionization and dissociation of the atomic and/or molecular composition of the process gas.

As feature sizes decrease below the 45 nm (nanometer) technology node, accurate processing and/or measurement data becomes more important and more difficult to obtain. Q-NB curing and/or hardening procedures can be used to more accurately process and/or measure these ultra-small devices and features. The data from a Q-NB curing and/or hardening procedure can be compared with the warning and/or control limits. When a run-rule is violated, an alarm can be generated indicating a processing problem, and correction procedures can be performed in real time.

Figure 1:
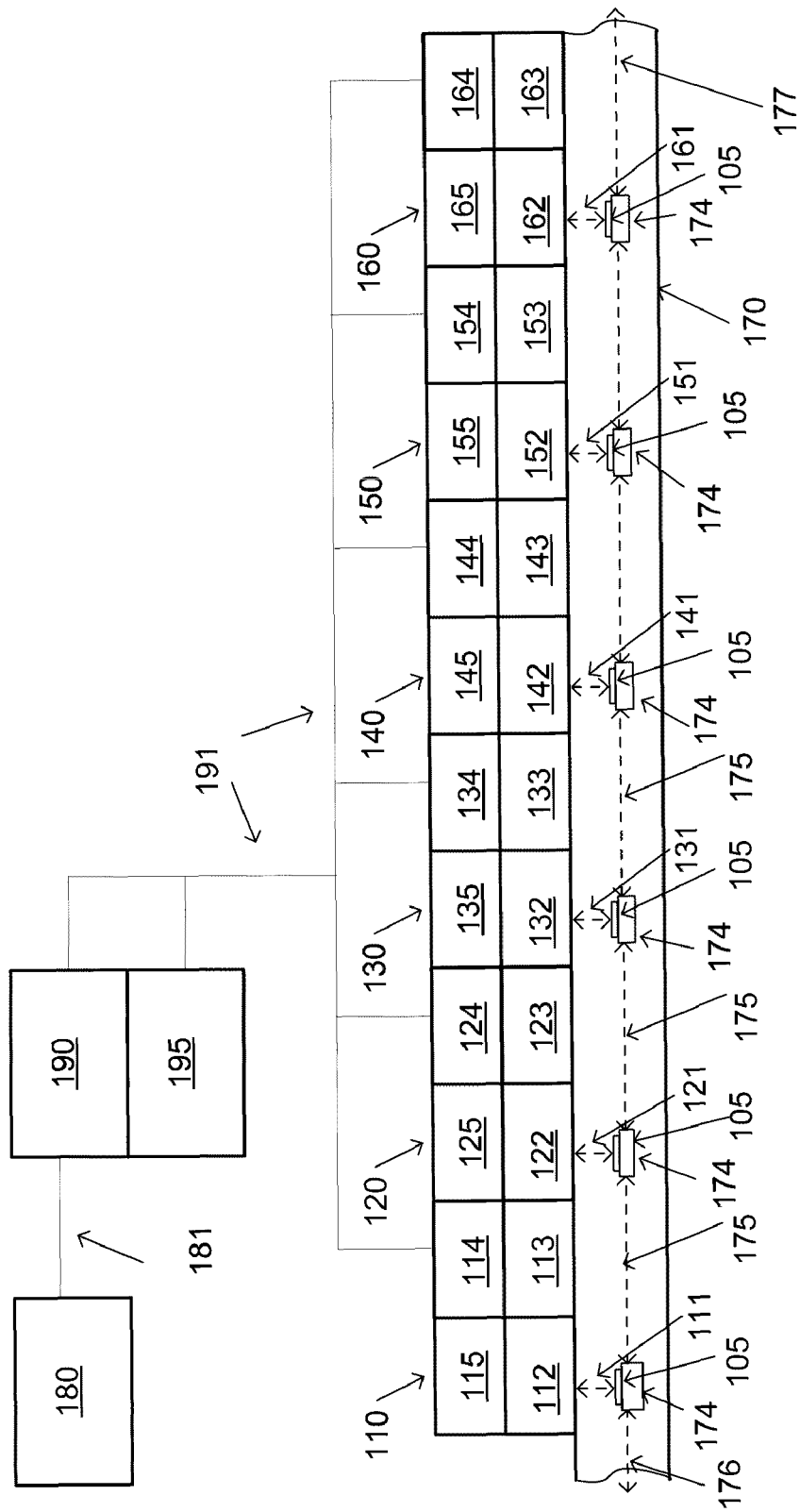
FIG. 1 shows an exemplary block diagram of a processing system in accordance with embodiments of the invention.

FIG. 1 shows an exemplary block diagram of a processing system in accordance with embodiments of the invention. In the illustrated embodiment, processing system 100 comprises a lithography subsystem 110, a exposure subsystem 120, an etch subsystem 130, a deposition subsystem 140, a Q-NB curing (hardening) subsystem 150, an evaluation subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used in multi-layer processing sequences and associated curing and/or hardening procedures.

The system controller 190 can be coupled to the lithography subsystem 110, the exposure subsystem 120, the etch subsystem 130, the deposition subsystem 140, the Q-NB curing (hardening) subsystem 150, the evaluation subsystem 160, and the transfer subsystem 170 using a data transfer subsystem 191. The system controller 190 can be coupled to the MES 180 using a first data transfer subsystem 181. Alternatively, other configurations may be used. For example, the etch subsystem 130, the deposition subsystem 140, the Q-NB curing (hardening) subsystem 150, the evaluation subsystem 160, and a portion of the transfer subsystem 170 can be subsystems available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled 111 to the transfer subsystem 170. The transfer subsystem 170 can be coupled 111 to the lithography subsystem 110, and one or more substrates 105 can be transferred via coupling 111 between the transfer subsystem 170 and the lithography subsystem 110 in real time. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to the one or more of the processing elements 113, and/or to one or more of the evaluation elements 115.

In some embodiments, the lithography subsystem 110 can perform coating procedures, thermal procedures, measurement procedures, inspection procedures, alignment procedures, and/or storage procedures on one or more substrates. For example, one or more lithography-related processes can be used to deposit one or more masking layers that can include radiation-sensitive material (photoresist), and/or anti-reflective coating (ARC) material, and can be used to thermally process (bake) one or more of the masking layers. In addition, lithography subsystem 110 can be used to develop, measure, and/or inspect one or more of the patterned masking layers on one or more of the substrates.

The exposure subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled 121 to the transfer subsystem 170. The transfer subsystem 170 can be coupled 121 to the exposure subsystem 120, and one or more substrates 105 can be transferred via coupling 121 between the transfer subsystem 170 and the exposure subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to the one or more of the processing elements 123, and/or to one or more of the evaluation elements 125.

In some embodiments, the exposure subsystem 120 can be used to perform wet and/or dry exposure procedures, and in other cases, the exposure subsystem 120 can be used to perform extreme ultraviolet (EUV) exposure procedures or e-beam writing procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled 131 to the transfer subsystem 170. The transfer subsystem 170 can be coupled 131 to the etch subsystem 130, and one or more substrates 105 can be transferred via coupling 131 between the transfer subsystem 170 and the etch subsystem 130 in real time. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135. For example, one or more of the processing elements 133 can be used to perform plasma or non-plasma etching, ashing, and cleaning procedures, or plasma or non-plasma etching procedures. Evaluation procedures and/or inspection procedures can be used to measure and/or inspect one or more surfaces and/or layers of the substrates.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled 141 to the transfer subsystem 170. The transfer subsystem 170 can be coupled 141 to the deposition subsystem 140, and one or more substrates 105 can be transferred via coupling 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to the one or more of the processing elements 143, and/or to one or more of the evaluation elements 145. For example, one or more of the processing elements 143 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the substrates.

The Q-NB curing (hardening) subsystem 150 can comprise one or more transfer/storage elements 152, one or more curing/hardening elements 153, one or more controllers 154, and one or more evaluation elements 155. One or more of the transfer/storage elements 152 can be coupled to one or more of the curing/hardening elements 153 and/or to one or more of the evaluation elements 155 and can be coupled 151 to the transfer subsystem 170. The transfer subsystem 170 can be coupled 151 to the Q-NB curing (hardening) subsystem 150, and one or more substrates 105 can be transferred via coupling 151 between the transfer subsystem 170 and the Q-NB curing (hardening) subsystem 150 in real time. For example, the transfer subsystem 170 can be coupled to one or more of the transfer/storage elements 152, to one or more of the curing/hardening elements 153, and/or to one or more of the evaluation elements 155. One or more of the controllers 154 can be coupled to one or more of the transfer/storage elements 152, to the one or more of the curing/hardening elements 153, and/or to one or more of the evaluation elements 155.

The evaluation subsystem 160 can comprise one or more transfer/storage elements 162, one or more measuring elements 163, one or more controllers 164, and one or more inspection elements 165. One or more of the transfer/storage elements 162 can be coupled to one or more of the measuring elements 163 and/or to one or more of the inspection elements 165 and can be coupled 161 to the transfer subsystem 170. The transfer subsystem 170 can be coupled 161 to the evaluation subsystem 160, and one or more substrates 105 can be transferred via coupling 161 between the transfer subsystem 170 and the evaluation subsystem 160 in real time. For example, the transfer subsystem 170 can be coupled to one or more of the transfer/storage elements 162, to one or more of the measuring elements 163, and/or to one or more of the inspection elements 165. One or more of the controllers 164 can be coupled to one or more of the transfer/storage elements 162, to the one or more of the measuring elements 163, and/or to one or more of the inspection elements 165. The evaluation subsystem 160 can comprise one or more measuring elements 163 that can be used to perform real-time optical evaluation procedures that can be used to measure target structures at one or more sites on a substrate using library-based or regression-based techniques. For example, the sites on substrate 105 can include curing-related sites, target sites, overlay sites, alignment sites, measurement sites, verification sites, inspection sites, or damage-assessment sites, or any combination thereof. For example, one or more "golden substrates" or reference chips can be stored and used periodically to verify the performance of one or more of the measuring elements 163, and/or one or more of the inspection elements 165.

In some embodiments, the evaluation subsystem 160 can include integrated Optical Digital Profilometry (iODP) elements (not shown), and iODP elements/systems are available from Timbre Technologies Inc. (a TEL company). Alternatively, other metrology systems and/or inspection systems may be used. For example, iODP techniques can be used to obtain real-time data that can include critical dimension (CD) data, gate structure data, and thickness data, and the wavelength ranges for the iODP data can range from less than approximately 200 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The evaluation subsystem 160 can use polarizing reflectometry, spectroscopic ellipsometry, reflectometry, or other optical measurement techniques to measure accurate device profiles, accurate CDs, and multiple layer film thickness of a substrate. The integrated metrology process (iODP) can be executed as an integrated process in an integrated group of subsystems. In addition, the integrated process eliminates the need to break the substrate for performing the analyses or waiting for long periods for data from external systems. IODP techniques can be used with the existing thin film metrology systems for inline profile and CD measurement, and can be integrated with TEL processing systems and/or lithography systems to provide real-time process monitoring and control. Simulated metrology data can be generated by applying Maxwell's equations and using a numerical analysis technique to solve Maxwell's equations.

The transfer subsystem 170 can comprise transfer elements 174 coupled to transfer tracks (175, 176, and 177) that can be used to receive substrates, transfer substrates, align substrates, store substrates, and/or delay substrates. For example, the transfer elements 174 can support two or more substrates. Alternatively, other transferring means may be used. The transfer subsystem 170 can load, transfer, store, and/or unload substrates based on a Q-NB curing and/or hardening procedure, a Q-NB curing-related processing sequence, a transfer sequence, operational states, the substrate and/or processing states, the processing time, the current time, the substrate data, the number of sites on the substrate, the type of sites on the substrates, the number of required sites, the number of completed sites, the number of remaining sites, or confidence data, or any combination thereof.

In some examples, transfer subsystem 170 can use loading data to determine where and when to transfer a substrate. In other examples, a transfer system can use Q-NB curing and/or hardening data to determine where and when to transfer a substrate. Alternatively, other procedures may be used. For example, when the first number of substrates is less than or equal to the first number of available processing elements, the first number of substrates can be transferred to the first number of available processing elements in the one or more of the subsystems using the transfer subsystem 170. When the first number of substrates is greater than the first number of available processing elements, some of the substrates can be stored and/or delayed using one or more of the transfer/storage elements (112, 122, 132, 142, 152, and 162) and/or the transfer subsystem 170.

In addition, the one or more subsystems (110, 120, 130, 140, 150, 160, and 170) can be used when performing lithography-related procedures, exposure-related procedures, inspection-related procedures, measurement-related procedures, evaluation-related procedures, etch-related procedures, deposition-related procedures, thermal processing procedures, coating-related procedures, alignment-related procedures, polishing-related procedures, storage-related procedures, transfer procedures, cleaning-related procedures, rework-related procedures, oxidation-related procedures, nitridation-related procedures, or external processing elements, or any combination thereof.

Operational state data can be established for the subsystems (110, 120, 130, 140, 150, 160, and 170) and can be used and/or updated by the Q-NB curing and/or hardening procedures. In addition, operational state data can be established for the transfer/storage elements (112, 122, 132, 142, 152, and 162), elements (113, 123, 133, 143, 153, and 163), and evaluation elements (115, 125, 135, 145, 155, and 165), and can be updated by Q-NB curing and/or hardening procedures. For example, the operational state data for the processing elements can include availability data, matching data for the processing elements, expected processing times for some process steps and/or sites, yield data, confidence data and/or risk data for the processing elements, or confidence data and/or risk data for one or more curing and/or hardening procedures. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using the data transfer subsystem 191. Alternatively, other coupling configurations may be used. The controllers can be coupled in series and/or in parallel and can have one or more input ports and/or one or more output ports. For example, the controllers may include microprocessors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time Q-NB curing and/or hardening procedures. A controller can receive real-time data from a Q-NB curing and/or hardening model to update subsystem, processing element, process, recipe, profile, image, pattern, simulation, sequence data, and/or model data. One or more of the controllers (114, 124, 134, 144, 154, 164, and 190) can be used to exchange one or more Semiconductor Equipment Communications Standard (SECS) messages with the Manufacturing Execution Systems (MES) 180 or other systems (not shown), read and/or remove information, feed forward, and/or feedback the information, and/or send information as a SECS message. One or more of the formatted messages can be exchanged between controllers, and the controllers can process messages and extract new data in real-time. When new data is available, the new data can be used in real-time to update a model and/or procedure currently being used for the substrate and/or lot. For example, the current layout can be examined using the updated model and/or procedure when the model and/or procedure can be updated before the current layout is examined. The current layout can be examined using a non-updated model and/or procedure when an update cannot be performed before the current layout is processed. In addition, formatted messages can be used when resists are changed, when resist models are changed, when processing sequences are changed, when design rules are changed, or when layouts are changed.

In some examples, the MES 180 may be configured to monitor some subsystem and/or system processes in real-time, and factory level intervention and/or judgment rules can be used to determine which processes are monitored and which data can be used. For example, factory level intervention and/or judgment rules can be used to determine how to manage the data when a Q-NB curing and/or hardening error condition occurs. The MES 180 can also provide modeling data, processing sequence data, and/or substrate data.

In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL), and external subsystems and/or tools may be included. For example, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another inspection system. The subsystems and/or processing elements can have different interface requirements, and the controllers can be configured to satisfy these different interface requirements.

One or more of the subsystems (110, 120, 130, 140, 150, 160, and 170) can perform control applications, Graphical User Interface (GUI) applications, and/or database applications. In addition, one or more of the subsystems (110, 120, 130, 140, 150, 160, and 170) and/or controllers (114, 124, 134, 144, 154, 164, and 190) can include Design of Experiment (DOE) applications, Advanced Process Control (APC) applications, Fault Detection and Classification (FDC) applications, and/or Run-to-Run (R2R) applications.

Output data and/or messages from Q-NB curing and/or hardening procedures can be used in subsequent procedures to optimize the process accuracy and precision. Data can be passed to Q-NB curing and/or hardening procedures in real-time as real-time variable parameters, overriding current model values, and reducing DOE tables. Real-time data can be used with a library-based system, or regression-based system, or any combination thereof to optimize a Q-NB curing and/or hardening procedure.

When a library-based process is used, the Q-NB curing and/or hardening data in the library can be generated and/or enhanced using Q-NB curing and/or hardening procedures, recipes, profiles, and/or models. For example, the Q-NB curing and/or hardening data in the library can include simulated and/or measured Q-NB curing and/or hardening data and corresponding sets of processing sequence data. The library-based processes can be performed in real-time. An alternative procedure for generating Q-NB curing and/or hardening data for a library can include using a machine learning system (MLS). For example, prior to generating the Q-NB curing and/or hardening data, the MLS can be trained using known input and output data, and the MLS may be trained with a subset of the Q-NB curing and/or hardening data.

Q-NB curing and/or hardening procedures can include intervention and/or judgment rules that can be executed whenever a matching context is encountered. Intervention and/or judgment rules and/or limits can be established based on historical procedures, on the customer's experience, or process knowledge, or obtained from a host computer. Rules can be used in Fault Detection and Classification (FDC) procedures to determine how to respond to alarm conditions, error conditions, fault conditions, and/or warning conditions. The rule-based FDC procedures can prioritize and/or classify faults, predict system performance, predict preventative maintenance schedules, decrease maintenance downtime, and extend the service life of consumable parts in the system. Various actions can take place in response to an alarm/fault, and the actions taken on the alarm/fault can be context-based, and the context data can be specified by a rule, a system/process recipe, a chamber type, identification number, load port number, cassette number, lot number, control job ID, process job ID, slot number and/or the type of data.

Unsuccessful Q-NB curing and/or hardening procedures can report a failure when one or more limits are exceeded, and successful procedures can create warning messages when limits are being approached. Pre-specified failure actions for procedures errors can be stored in a database, and can be retrieved from the database when an error occurs. For example, Q-NB curing and/or hardening procedures can reject the data at one or more of the sites for a substrate when a measurement procedure fails.

Q-NB curing and/or hardening procedures can be used to create, modify, and/or evaluate isolated and/or nested structures at different times and/or sites. For example, gate stack dimensions and substrate thickness data can be different near isolated and/or nested structures, and gate stack dimensions and substrate thickness data can be different near open areas and/or trench array areas. The hardened radiation-sensitive material (photoresist) features created by the Q-NB curing and/or hardening procedure can subsequently be used to create optimized features and/or structures for etched isolated and/or nested structures.

The Q-NB curing and/or hardening procedures can be used to reinforce the radiation-sensitive material (photoresist) film, supply optimum polymers, and suppress dissociation of the process gas. Therefore, the surface roughness of the radiation-sensitive material (photoresist) can be decreased. Further, the CD of an opening portion formed in the radiation-sensitive material (photoresist) film can be prevented from expanding, thereby realizing pattern formation with high accuracy. Particularly, these effects are more enhanced by controlling the DC voltage to suitably exercise the three functions described herein, i.e., the sputtering function, plasma optimizing function, and electron supply function.

The amount of by-products deposited during a Q-NB curing and/or hardening procedure depends on the potential difference between the plasma and the DC electrode, chamber wall, or the like.

Figure 2A:
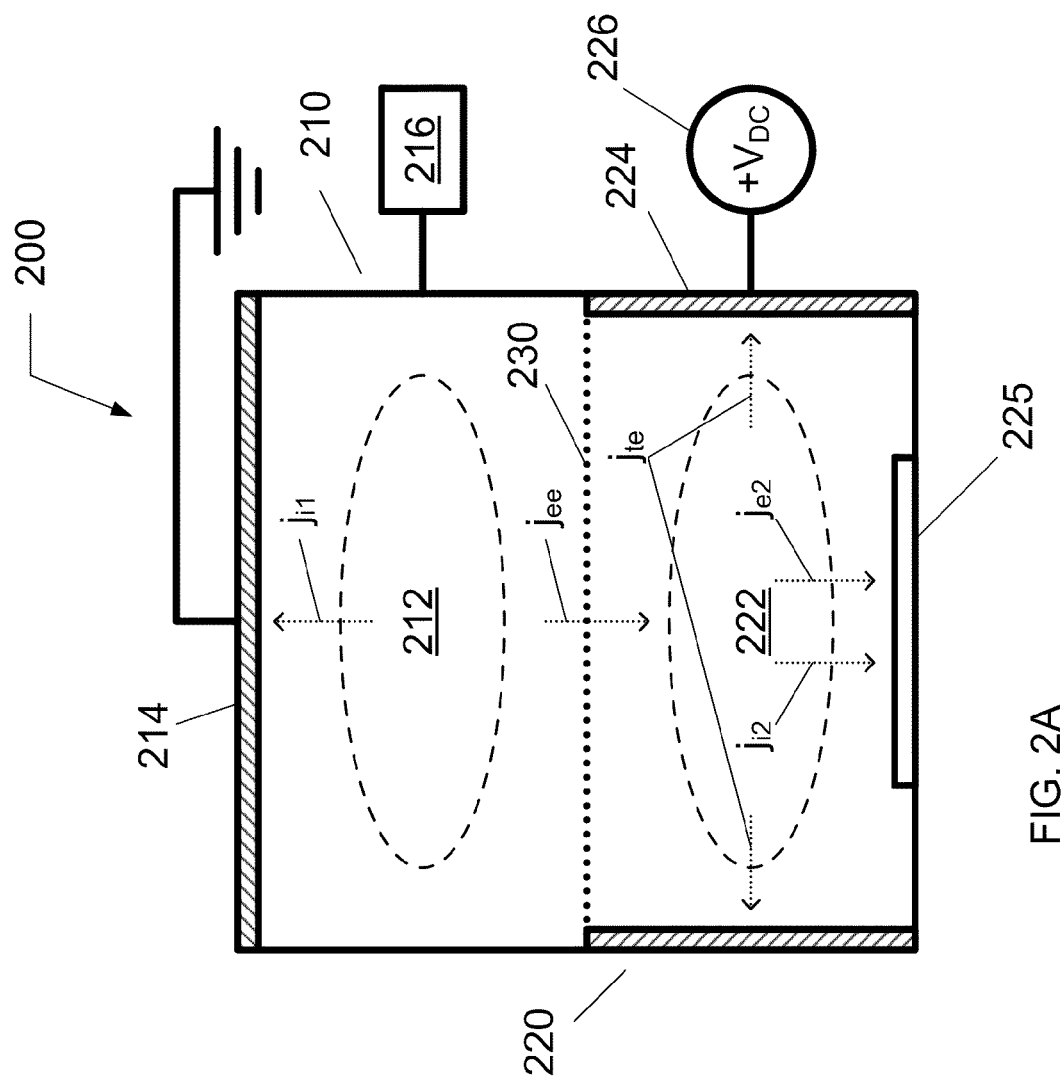
FIG. 2A shows a simplified Q-NB curing (hardening) subsystem according to an embodiment.

FIG. 2A shows a simplified block diagram of a Q-NB curing (hardening) subsystem in accordance with embodiments of the invention. In the illustrated embodiment shown in FIG. 2A, a Q-NB curing (hardening) subsystem 200 is described that is configured to cure and/or harden an unpatterned and/or a patterned radiation-sensitive material (photoresist) layer on a substrate with a space-charge neutralized quasi-neutral beam activated curing (hardening) process.

Figure 2B:
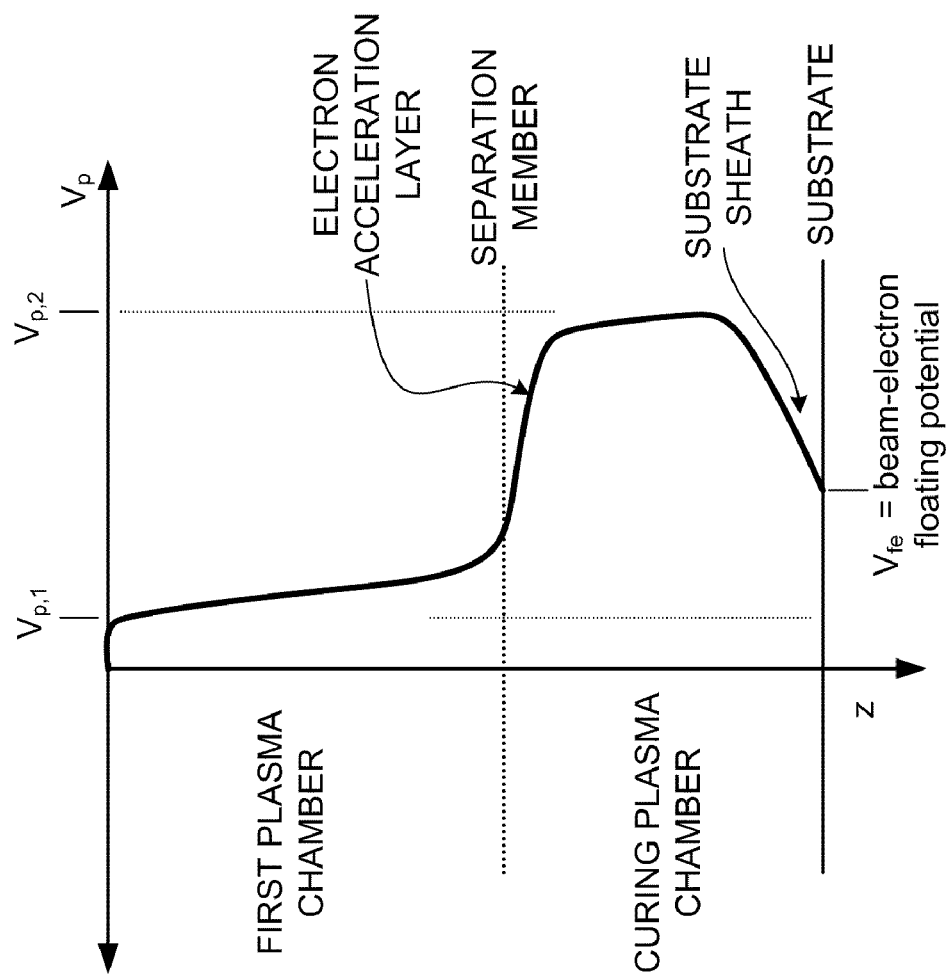
FIG. 2B illustrates conditions for a curing and/or hardening process to be performed in the Q-NB curing (hardening) subsystem depicted in FIG. 2A.

FIG. 2B illustrates conditions for a curing and/or hardening process to be performed in the Q-NB curing (hardening) subsystem depicted in FIG. 2A. A beam-electron floating potential ($V_{fe}$) is shown that exists because somewhere in the plasma there are insulator surfaces that are not under beam-electron bombardment; instead, these surfaces are under a Maxwellian thermal electron flux. The floating potential of these surfaces are the ($V_{fm}$) which is the "thermal Maxwellian floating potential".

As illustrated in FIGS. 2A and 2B, the Q-NB curing (hardening) subsystem 200 can comprise a first plasma chamber 210 for forming a first plasma 212 at a first plasma potential ($V_{p,1}$), and a curing (hardening) plasma chamber 220 for forming a curing (hardening) plasma 222 at a curing (hardening) plasma potential ($V_{p,2}$) greater than the first plasma potential. The first plasma 212 is formed by coupling power, such as radio frequency (RF) power, to an ionizable gas in the first plasma chamber 210, while the curing (hardening) plasma 222 is formed using electron flux (e.g., energetic electron (ee) current, $j_{ee}$) from the first plasma 212. The RF power ranges from approximately 200 watts to approximately 20,000 watts. Further, the curing (hardening) plasma chamber 211 comprises a substrate holder configured to position a substrate 225 at a floating potential in the curing (hardening) plasma chamber 220 to be exposed to the curing (hardening) plasma 222 at the curing (hardening) plasma potential.

The first plasma chamber 210 comprises a plasma generation system 216 configured to ignite and heat the first plasma 212. The first plasma 212 may be heated by any conventional plasma generation system including, but not limited to, an inductively coupled plasma (ICP) source, a transformer coupled plasma (TCP) source, a capacitively coupled plasma (CCP) source, an electron cyclotron resonance (ECR) source, a helicon wave source, a surface wave plasma source, a surface wave plasma source having a slotted plane antenna, etc. Although the first plasma 212 may be heated by any plasma source, it is desired that the first plasma 212 be heated by a method that produces a reduced or minimum fluctuation in its plasma potential ($V_{p,1}$). For example, an ICP source is a practical technique that produces a reduced or minimum ($V_{p,1}$) fluctuation.

Additionally, the first plasma chamber 210 comprises a direct current (DC) conductive ground electrode 214 having a conductive surface that acts as a boundary in contact with the first plasma 212. The DC conductive ground electrode 214 is coupled to DC ground. The DC conductive ground electrode 214 acts as an ion sink that is driven by the first plasma 212 at the first plasma potential ($V_{p,1}$). Although one DC conductive ground electrode 214 is shown in FIG. 2A, the Q-NB curing (hardening) subsystem 200 may comprise one or more DC conductive ground electrodes.

Although not necessary, it is desirable that the DC conductive ground electrode 214 comprises a relatively large area in contact with the first plasma 212. The larger the area at DC ground, the lower the first plasma potential. For example, the surface area of the conductive surface for the DC conductive ground electrode 214 in contact with the first plasma 212 may be greater than any other surface area in contact with the first plasma 212. Additionally, for example, the surface area of the conductive surface for the DC conductive ground electrode 214 in contact with the first plasma 212 may be greater than the total sum of all other conductive surfaces that are in contact with the first plasma 212. Alternatively, as an example, the conductive surface for the DC conductive ground electrode 214 in contact with the first plasma 212 may be the only conductive surface that is in contact with the first plasma 212. The DC conductive ground electrode 214 may offer the lowest impedance path to ground.

As described above, (energetic) electron flux (or electron current $j_{ee}$) from the first plasma 212 initiates and sustains the curing (hardening) plasma 222 in the curing (hardening) plasma chamber 220. In order to control the electron flux and produce a mono-energetic space-charge neutralized quasi-neutral beam, the first plasma potential ($V_{p,1}$), as described above, and the curing (hardening) plasma potential ($V_{p,2}$) should be stable with substantially reduced or minimal fluctuations if any fluctuations at all. To achieve this stability in the curing (hardening) plasma 222, the curing (hardening) plasma chamber 220 comprises a DC conductive bias electrode 224 having a conductive surface in contact with the curing (hardening) plasma 222, wherein the DC conductive bias electrode 224 is coupled to a DC power source 226. The DC power source 226 is configured to bias the DC conductive bias electrode 224 at a positive DC voltage (+VDC). As a result, the curing (hardening) plasma potential ($V_{p,2}$) is a boundary-driven plasma potential driven by a (+VDC) voltage source, thus causing ($V_{p,2}$) to rise to about +VDC and remain substantially stable. Although one DC conductive bias electrode 224 is shown in FIG. 2A, the Q-NB curing (hardening) subsystem 200 may comprise one or more DC conductive bias electrodes.

Furthermore, the Q-NB curing (hardening) subsystem 200 comprises a separation member 230 disposed between the first plasma chamber 210 and the curing (hardening) plasma chamber 220. The separation member 230 may act as an electron diffuser. The electron diffusion is driven by an electric field through an electron acceleration layer created by the potential difference $\Delta V = \{(V_{p,2})-(V_{p,1})\}$. The separation member 230 may comprise an insulator, such as quartz or alumina, or the separation member 230 may comprise a dielectric coated conductive material that is electrically floating and has high RF impedance to ground. Due to the large electric field across the electron acceleration layer $\Delta V = \{(V_{p,2})-(V_{p,1})\}$, the electron flux is sufficiently energetic to sustain ionization in the curing (hardening) plasma 222. However, the Q-NB curing (hardening) subsystem 200 may optionally comprise a plasma heating system configured to further heat the curing (hardening) plasma 222.

The separation member 230 may comprise one or more openings to permit the passage of the energetic electron flux from the first plasma chamber 210 to the curing (hardening) plasma chamber 220. The total area of the one or more openings can be adjusted relative to the surface area of the DC conductive ground electrode 214 to ensure a relatively large potential difference $\Delta V = \{(V_{p,2})-(V_{p,1})\}$ while minimizing reverse ion current from the curing (hardening) plasma 222 to the first plasma 212, and thereby ensure a sufficient ion energy for ions striking the substrate 225.

As illustrated in FIG. 2A, a first ion flux (e.g., ion current, $j_{i1}$) from a first population of ions in the first plasma 212 flows to the DC conductive ground electrode 214 in the first plasma chamber 210 in a quantity approximately equivalent to the energetic electron flux (or electron current $j_{ee}$) from the first plasma 212 through the electron acceleration layer at the separation member 230 into the curing (hardening) plasma 222, i.e., $|j_{i1}| \sim |j_{ee}|$.

As described above, the energetic electron flux is sufficiently energetic to form the curing (hardening) plasma 222. Therein, a population of thermal electrons and a second population of ions are formed. The thermal electrons are largely a result of ejected electrons upon ionization of the curing (hardening) plasma 222 by the incoming energetic electron flux (or electron current $j_{ee}$). However, some energetic electrons from the energetic electron flux may lose a sufficient amount of energy and, thus, become part of the thermal electron population.

Due to Debye shielding, only the thermal electrons of the curing (hardening) plasma 222 flow to the DC conductive bias electrode 224 (e.g., thermal electron current, $j_{te}$) in a quantity approximately equal to the energetic electron flux, i.e., $|j_{te}| \sim |j_{ee}|$. While thermal electron current $j_{te}$ is directed to the DC conductive bias electrode 224, a second ion flux from the second population of ions is directed to the substrate at $(V_{p,2})$ (as ion current, $j_{i2}$; which is approximately equivalent to the sum of the energetic current to the substrate 225, $j_{ee}$, and the energetic electron generated secondary electron current ($j_{ese}$).

If the incoming energetic electron energy is sufficiently high, a substantial fraction of the energetic electron flux ($j_{ee}$) will survive the passage through the curing (hardening) plasma 222 and strike wafer 225. However, regardless of their origin (i.e., energetic electrons from energetic electron flux $j_{ee}$ or energetic electrons from the thermal electron population), only energetic electrons capable of passing through the substrate sheath (i.e. climbing the potential "hill", or $\{(V_{fe})-(V_{p,1})\}$, wherein ($Vf_e$) is the energetic electron floating potential) will reach substrate 225. Since substrate 225 is at floating DC ground, the ion current $j_{i2}$ that is fed by the second ion population in the curing (hardening) plasma 222 (having ion energy characterized by $\{(V_{p,2})-(V_{fe})\}$ will be equivalent to the electron current $j_{e2}$ (i.e., no net current, or $|j^{i2}| \sim |j_{e2}|$ or $j_{i2}+j_{e2} \sim j_{i2}+j_{ee}+j_{ese} \sim 0$). Alternatively, the substrate 225 may be at approximately DC ground since the floating-ground surface potential is expected to be slightly above DC ground.

In such a configuration for the Q-NB curing (hardening) subsystem 200, the elevation of the curing (hardening) plasma potential above the first plasma potential drives an energetic electron beam (having electron current $j_{ee}$) to form the curing (hardening) plasma 222, while particle balance throughout the Q-NB curing (hardening) subsystem 200 enforces an equal number of electrons (e.g., electron current, $j_{e2}$) and ions (e.g., ion current, $j_{i2}$) striking substrate 225 (i.e., $|j_{i2}| \sim |j_{e2}|$). This charge balance manifests as a space-charge neutralized quasi-neutral beam directed to substrate 225 that activates a curing (hardening) and/or hardening process at the substrate 225.

Figure 3:
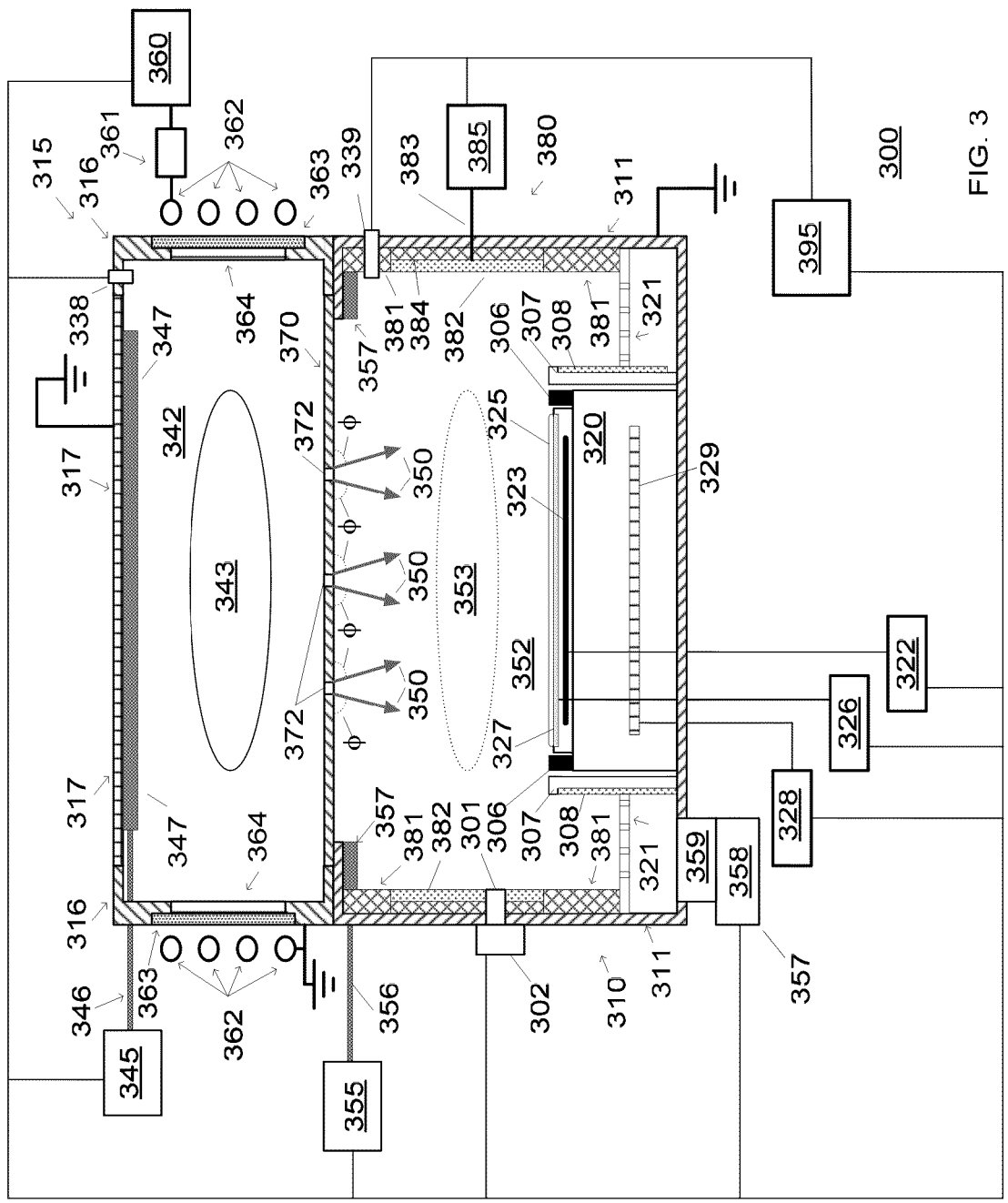
FIG. 3 shows an exemplary block diagram of another Q-NB curing (hardening) subsystem in accordance with embodiments of the invention.

FIG. 3 shows an exemplary block diagram of a Quasi-Neutral Beam (Q-NB) curing (hardening) subsystem in accordance with embodiments of the invention.

In the illustrated embodiment, an exemplary Q-NB curing (hardening) system 300 is shown, and the exemplary Q-NB curing (hardening) system 300 can comprise a plasma generation chamber 316 that can be configured to produce a first plasma 343 at a first plasma potential, and a curing (hardening) chamber 311 that can be configured to provide a contaminant-free, vacuum environment for performing a Q-NB curing (hardening) procedure using a patterned substrate 325. The Q-NB curing (hardening) subsystem 310 can include a substrate holder 320 configured to support the patterned substrate 325, and a pressure control system 335. In some examples, the pressure control system 335 can include a vacuum pump 336 and a gate valve 337 that can be coupled to the curing (hardening) chamber 311 and configured to evacuate the curing (hardening) chamber 311 and control a pressure in the curing (hardening) chamber 311. Alternatively, the pressure control system 335 can be configured using a different number of pumps and/or a different number of flow control devices.

The plasma generation chamber 316 can include a first plasma region 342 that can be configured to receive a first process gas at a first pressure and can be configure to form first plasma 343. The curing (hardening) chamber 311 can include a curing (hardening) plasma region 352 disposed downstream of the first plasma region 342. The curing (hardening) chamber 311 can be configured to receive electron flux and one or more plasma species from the first plasma region 342 and form curing (hardening) plasma 353 therein at a curing (hardening) plasma potential and a second pressure. For example, the separation member 370 can include a plurality of openings 372, and each of the openings 372 can be configured to create a beam 350 that can have a beam angle ($\phi$). The beam angle ($\phi$) can vary from approximately 80 degrees to approximately 89.5 degrees.

A first gas supply system 345 can be coupled to one or more first gas distribution elements 347 using at least one first supply line 346. The first gas distribution element 347 can be configured within the plasma generation chamber 316 and can be used to introduce the first process gas to the first plasma region 342. Alternatively, a different introduction method may be used. The first process gas can comprise an electropositive gas, or an electronegative gas, or a mixture thereof. For example, the first process gas may comprise a noble gas, such as argon (Ar). Additionally, for example, the first process gas may comprise any gas suitable for performing a Q-NB curing and/or hardening procedure using the patterned substrate 325. In addition, the first process gas may comprise any gas having chemical constituents, atomic or molecular, suitable for performing a Q-NB curing and/or hardening procedure using the patterned substrate 325. These chemical constituents may comprise etchants, film-forming gases, dilutants, cleaning gases, etc. The first gas supply system 345 can include one or more gas supplies or gas sources, one or more control valves, one or more filters, one or more mass flow controllers, one or more measurement devices, etc. The first supply line 346 and/or the first gas distribution element 347 can one or more control valves, one or more filters, one or more mass flow controllers, etc.

An optional curing (hardening) gas supply system 355 can be coupled to a curing (hardening) gas distribution element 357 using at least one second supply line 356. The curing (hardening) gas distribution element 357 can be configured within the curing (hardening) chamber 311 and can be used to introduce at least one curing (hardening) gas to the curing (hardening) plasma region 352. Alternatively, a different introduction method may be used. The curing (hardening) gas may comprise any gas suitable for performing a Q-NB curing (hardening) procedure using the patterned substrate 325. Additionally, for example, the curing (hardening) gas may comprise any gas having chemical constituents, atomic or molecular, suitable for performing a Q-NB curing (hardening) procedure using the patterned substrate 325. These chemical constituents may comprise etchants, film-forming gases, dilutants, cleaning gases, etc. The curing (hardening) gas supply system 355 may include one or more gas supplies or gas sources, one or more control valves, one or more filters, one or more mass flow controllers, one or more measurement devices, etc. The second supply line 356 and/or the curing (hardening) gas distribution element 357 can one or more control valves, one or more filters, one or more mass flow controllers, etc.

In various embodiments, the plasma species associated with the first gas supply system 345 can include Argon (Ar), $CF_4$, $F_2$, $C_4F_8$, CO, $C_5F_8$, $C_4F_6$, $CHF_3$, $N_2/H_2$, or HBr, or any combination of two or more thereof. The plurality of first gas distribution elements 347 can provide different flow rates to different regions of the first plasma region 342. In addition, the plasma species associated with the curing (hardening) gas supply system 355 can include Argon (Ar), $CF_4$, $F_2$, $C_4F_8$, CO, $C_5F_8$, $C_4F_6$, $CHF_3$, $N_2/H_2$, or HBr, or any combination of two or more thereof. The plurality of curing (hardening) gas distribution elements 357 can provide different flow rates to different regions of the curing (hardening) plasma region 352.

When the first process gas and or the curing (hardening) gas includes at least one fluorocarbon gas and at least one inert gas, a first fluorocarbon gas flow rate varying between approximately 10 sccm and approximately 50 sccm and a first inert gas flow rate varying between approximately 3 sccm and approximately 20 sccm, and the fluorocarbon gas comprises $C_4F_6$, $C_4F_8$, $C_5F_8$, $CHF_3$, or $CF_4$, or any combination thereof, and the inert gas comprises Argon (Ar), Helium (He), Krypton (Kr), Neon (Ne), Radon (Rn), or Xenon (Xe), or any combination thereof.

When the first process gas and or the curing (hardening) gas includes CO, the CO flow rate can vary between approximately 2 sccm and approximately 20 sccm.

In addition, the exemplary Q-NB curing (hardening) system 300 can comprise a power source 360 and a first multi-turn inductive coil 362 that can be coupled to the power source 360. The power source 360 may comprise a radio frequency (RF) generator that couples RF power through an impedance match network 361 to the first multi-turn inductive coil 362. For example, the RF power from the power source 360 can range from approximately 200 watts to approximately 10000 watts. RF power is inductively coupled from the first multi-turn inductive coil 362 through a dielectric window 363 to the first plasma 343 in the first plasma region 342. The impedance match network 361 can be used to improve the transfer of RF power to plasma by reducing the reflected power. Match network topologies (e.g. L-type, u-type, T-type, etc.) and automatic control methods are well known to those skilled in the art.

A typical frequency for the application of RF power to the first multi-turn inductive coil 362 can range from about 10 MHz to about 100 MHz. In addition, a slotted Faraday shield 364 can be employed to reduce capacitive coupling between the first multi-turn inductive coil 362 and plasma. Although the first plasma may be heated by any plasma source, it is desired that the first plasma be heated by a method, as previously shown in FIG. 2A and FIG. 2B, that produces a minimum fluctuation in its plasma potential ($V_{p,1}$).

In alternate embodiments, a different plasma generation system (not shown) can be coupled to the plasma generation chamber 316 and configured to generate the first plasma 343 in the first plasma region 342. The different plasma generation system may include a system configured to produce a capacitively coupled plasma (CCP), an inductively coupled plasma (ICP), a transformer coupled plasma (TCP), a surface wave plasma, a helicon wave plasma, or an electron cyclotron resonant (ECR) heated plasma, or other type of plasma understood by one skilled in the art of plasma formation. In addition, any ICP source can be used that produces a reduced or minimum ($V_{p,1}$) fluctuation.

As an example, in an electropositive discharge, the electron density may range from approximately $10^{10}$ cm$^{-3}$ to $10^{13}$ cm$^{-3}$, and the electron temperature may range from about 1 eV to about 10 eV (depending on the type of plasma source utilized).

Still referring to FIG. 3, the plasma generation subsystem 315 can include a plasma generation chamber 316 that can include a direct current (DC) conductive electrode 317 having a conductive surface that acts as a boundary in contact with the first plasma 343. The DC conductive ground electrode 317 is coupled to DC ground. For example, the DC conductive ground electrode 317 may comprise a doped silicon electrode. The DC conductive ground electrode 317 acts as an ion sink that is driven by the first plasma 343 at the first plasma potential ($V_{p,1}$). Although a single DC conductive ground electrode 317 is shown in FIG. 3, the Q-NB curing (hardening) system 300 may comprise one or more DC conductive ground electrodes.

Although not necessary, it is desirable that the DC conductive ground electrode 317 comprises a relatively large area in contact with the first plasma 343. The larger the area at DC ground, the lower the first plasma potential. For example, the surface area of the conductive surface for the DC conductive ground electrode 317 in contact with the first plasma 343 may be greater than any other surface area in contact with the first plasma 343. Additionally, for example, the surface area of the conductive surface for the DC conductive ground electrode 317 in contact with the first plasma 343 may be greater than the total sum of all other conductive surfaces that are in contact with the first plasma 343. Alternatively, as an example, the conductive surface for the DC conductive ground electrode 317 in contact with the first plasma 343 may be the only conductive surface that is in contact with the first plasma 343. The DC conductive ground electrode 317 may offer the lowest impedance path to ground.

In addition, the Q-NB curing (hardening) subsystem 310 can comprise a bias electrode system 380 coupled to the curing (hardening) chamber 311. The bias electrode system 380 can be configured to elevate the curing (hardening) plasma potential to a value above the first plasma potential in order to drive the electron flux in the correct direction. The bias electrode system 380 can include one or more DC conductive bias electrodes 382 that have at least one conductive surface in contact with the curing (hardening) plasma 353. The DC conductive bias electrode 382 can be electrically insulated from the curing (hardening) chamber 311 using at least one insulator 384 and the DC conductive bias electrode 382 is coupled to a DC power source 385. The conductive bias electrode 382 is composed of a conductive material, such as metal or doped silicon. In addition, one or more electrical supply elements 383 can be configured to allow electrical connection to the DC conductive bias electrode 382.

Although a single DC conductive bias electrode 382 is shown in FIG. 3, the Q-NB curing (hardening) subsystem 310 can comprise one or more DC conductive bias electrodes.

Although not necessary, it is desirable that the DC conductive bias electrode 382 comprises a relatively large area in contact with the curing (hardening) plasma 353. The larger the area at the +VDC potential, the closer the curing (hardening) plasma potential will be to +VDC. As an example, the total area of the DC conductive bias electrode 382 may be greater than the total sum of all other conductive surfaces that are in contact with the curing (hardening) plasma 353. Alternatively, as an example, the total area of the DC conductive bias electrode 382 may be the only conductive surface that is in contact with the curing (hardening) plasma 353.

The DC power source 385 can include a variable DC power supply. Additionally, the DC power source 385 can include a bipolar DC power supply. The DC power source 385 can further include a system configured to perform at least one of monitoring adjusting, or controlling the polarity, current, voltage, or on/off state of the DC power source 385. An electrical filter may be utilized to de-couple RF power from the DC power source 385.

For example, the DC voltage applied to the DC conductive bias electrode 382 by DC power source 385 may range from approximately 0 volts (V) to approximately 10000 V. Desirably, the DC voltage applied to the DC conductive bias electrode 382 by DC power source 385 may range from approximately 50 volts (V) to approximately 5000 V. Additionally, it is desirable that the DC voltage has a positive polarity. Furthermore, it is desirable that the DC voltage is a positive voltage having an absolute value greater than approximately 50 V.

As shown in FIG. 3, the curing (hardening) chamber 311 can include one or more chamber housing members that may be coupled to ground. Additionally, a liner member 381 can be disposed between one or more of the walls of the curing (hardening) chamber 311 and the curing (hardening) plasma 353. For example, each liner member 381 can be fabricated from a dielectric material, such as quartz or alumina, and the liner member 381 can provide a high RF impedance to ground for the curing (hardening) plasma 353.

In addition, the Q-NB curing (hardening) system 300 can include at least one separation member 370 that can be configured between the first plasma region 342 and the curing (hardening) plasma region 352. The separation member 370 can include one or more openings 372 that can be configured to create a plurality of beams 350 that can include at least one plasma species as well as an electron flux from the first plasma 343 in the first plasma region 342 to the curing (hardening) plasma region 352. For example, the electrons and/or ions in the plurality of beams 350 can be used to form the curing (hardening) plasma 353 in the curing (hardening) plasma region 352.

One or more of the openings 372 in the separation member 370 can comprise a super-Debye length apertures, i.e., the transverse dimension or diameter is larger than the Debye length. The openings 372 can be sufficiently large to permit adequate electron transport, and the openings 372 may be sufficiently small to allow a sufficiently high potential difference between the first plasma potential and the curing (hardening) plasma potential and to reduce any reverse ion current between the curing (hardening) plasma 353 and the first plasma 343. Further, the one or more openings 372 may be sufficiently small to sustain a pressure difference between the first pressure in the first plasma region 342 and the second pressure in the curing (hardening) plasma region 352.

Although the DC conductive ground electrode 317 is coupled to DC ground, it may be coupled to a DC voltage less than the bias DC voltage coupled to the DC conductive bias electrode 382.

As illustrated in FIG. 3, the plurality of beams 350 can include an electron flux that occurs between the first plasma region 342 and the curing (hardening) plasma region 352 through separation member 370. The electron transport is driven by electric field-enhanced diffusion, wherein the electric field is established by the potential difference between the first plasma potential and the curing (hardening) plasma potential. The plurality of beams 350 can include an electron flux that can be sufficiently energetic to sustain ionization in the curing (hardening) plasma 353.

Pressure control system 335 can include a pump 336 that can be a turbo-molecular vacuum pump (TMP) capable of a pumping speed up to 5000 liters per second (and greater) and a vacuum valve 337 (or second vacuum valve), such as a gate valve, for controlling the pressure in the curing (hardening) plasma region 352. Furthermore, one or more sensors 339 for monitoring chamber conditions can be coupled to the curing (hardening) chamber 311, and one or more of the sensors 339 can be used to measure pressure in the curing (hardening) chamber 311.

In some embodiments, the Q-NB curing (hardening) subsystem 310 can include a substrate holder 320 that can be coupled to ground. If the substrate holder 320 is coupled to ground, the patterned substrate 325 can be at floating ground and, therefore, the only ground the curing (hardening) plasma 353 contacts is the floating ground provided by patterned substrate 325. For example, when the patterned substrate 325 is clamped to substrate holder 320, a ceramic electrostatic clamp (ESC) layer may insulate the patterned substrate 325 from the grounded substrate holder 320.

Referring still to FIG. 3, the Q-NB curing (hardening) subsystem 310 can include a substrate temperature control system 328 coupled to the substrate holder 320 and configured to adjust and control the temperature of patterned substrate 325. The substrate temperature control system 328 can include temperature control elements 329 in the substrate holder 320 that can be used to control the temperature of the patterned substrate 325. Alternatively, the temperature control elements (not shown) may be configured in the chamber wall of the curing (hardening) chamber 311 and any other component within the Q-NB curing (hardening) subsystem 310.

In order to improve the thermal transfer between the patterned substrate 325 and substrate holder 320, the substrate holder 320 can include electrostatic clamping (ESC) electrode 323 that can be coupled to a clamping supply 322 to affix the patterned substrate 325 to an upper surface of substrate holder 320. In some embodiments, the electrostatic clamping (ESC) electrode 323 can be used to isolate the patterned substrate 325 from the grounded substrate holder 320.

Furthermore, substrate holder 320 can further include backside gas elements 327 that can be coupled to a backside gas delivery system 326 that can be configured to introduce gas to the backside of the patterned substrate 325 in order to improve the gas-gap thermal conductance between the patterned substrate 325 and substrate holder 320. Such a system can be utilized when temperature control of the patterned substrate 325 is required at elevated or reduced temperatures. For example, the substrate backside gas delivery system 326 can be coupled to a two-zone (center/edge) backside gas elements 327, wherein the helium gas gap pressure can be independently varied between the center and the edge of the patterned substrate 325. In other embodiments, the backside gas elements 327 can be used to isolate the patterned substrate 325 from the grounded substrate holder 320.

In addition, the substrate holder 320 may be surrounded by a baffle member 321 that extends beyond a peripheral edge of the substrate holder 320. The baffle member 321 may serve to homogeneously distribute the pumping speed delivered by the pressure control system 335 to the curing (hardening) plasma region 352. The baffle member 321 may be fabricated from a dielectric material, such as quartz, or alumina. The baffle member 321 may provide a high RF impedance to ground for the curing (hardening) plasma 353.

A transfer port 301 for a semiconductor substrate is formed in the sidewall of the curing (hardening) chamber 311, and can be opened/closed by a gate valve 302 attached thereon. One or more of the controllers 395 can be coupled to gate valve 302 and can be configured to control gate valve 302. The patterned substrate 325 can be, for example, transferred into and out of curing (hardening) chamber 311 through transfer port 301 and gate valve 302 from a transfer subsystem (170, FIG. 1), and it can be received by substrate lift pins (not shown) housed within substrate holder 320 and mechanically translated by devices (not show) housed therein. After the patterned substrate 325 is received from transfer system, it can be lowered to an upper surface of substrate holder 320. The design and implementation of substrate lift pins is well known to those skilled in the art. Alternatively, an un-patterned substrate may be used.

In some embodiments, a conductive focus ring 306 can be used, and the conductive focus ring 306 can include a silicon-containing material and can be disposed on the top of the substrate holder 320. In some examples, conductive focus ring 306 can be configured to surround the electrostatic electrode 323, the backside gas elements 327, and the patterned substrate 325 to improve uniformity at the edge of the substrate. In other examples, the conductive focus ring 306 can include a correction ring portion (not shown) that can be used to modify the edge temperature of the patterned substrates 325. Alternatively, a non-conductive focus ring may be used.

In other embodiments, an inner deposition shield 308 can be detachably coupled to the substrate holder 320 to prevent by-products created during curing (hardening) procedures from being deposited on the substrate holder 320. In addition, an outer deposition shield (not shown) can be detachably coupled along one or more of the inner walls of the curing (hardening) chamber 311 to prevent by-products created during curing (hardening) procedures from being deposited on the wall. For example, the outer deposition shield can be configured as a part of a chamber wall. The baffle member 321 and the deposition shield 308 can include an aluminum body covered with a ceramic, such as $Y_2O_3$. The gate valve 337 can be coupled to an exhaust space formed at the bottom of the curing (hardening) chamber 311.

As depicted in FIG. 3, the Q-NB curing (hardening) subsystem 310 can include one or more first process sensors 338 coupled to the first plasma region 342 and one or more second process sensors 339 coupled to the curing (hardening) plasma region 352. Alternatively, the number and position of the process sensors (338, 339) may be different. In various embodiments, the first process sensors 338 can include one or more optical devices for monitoring the light emitted from the first plasma 343 in the first plasma region 342, and the second process sensors 339 can include one or more optical devices for monitoring the light emitted from the curing (hardening) plasma 353 in the curing (hardening) plasma region 352. For example, one or more Optical Emission Spectroscopy (OES) sensors may be used, and the OES data can be used as ignition data, operational data, or endpoint data.

One or more of the process sensors (338, 339) can include gas-sensing devices for monitoring and/or controlling input gasses, process gasses, and/or exhaust gasses. In addition, the one or more of the process sensors (338, 339) can include pressure sensors, temperature sensors, current and/or voltage probes, power meters, spectrum analyzers, or an RF Impedance analyzer, or any combination thereof.

In addition, the Q-NB curing (hardening) subsystem 310 can include one or more internal sensors (not shown), and the internal sensors can include those sensors pertaining to the functionality of curing (hardening) chamber 311, such as the measurement of the Helium backside gas pressure, Helium backside flow, electrostatic clamping (ESC) voltage, ESC current, substrate holder temperature (or lower electrode (LEL) temperature), coolant temperature, DC conductive bias electrode temperature, DC bias, forward RF power, reflected RF power, RF peak-to-peak voltage, chamber wall temperature, process gas flow rates, process gas partial pressures, matching network settings, a focus ring thickness, RF hours, focus ring RF hours, and any statistic thereof.

Controller 395 can include one or more microprocessors, one or more memory elements, and one or more analog and/or digital I/O devices (potentially including D/A and/or ND converters) capable of generating control voltages sufficient to communicate and activate inputs to the Q-NB curing (hardening) system 300 as well as monitor outputs from Q-NB curing (hardening) system 300. As shown in FIG. 3, controller 395 can be coupled to and exchange information with gate valve 302, a clamping supply 322, backside gas delivery system 326, temperature control system 328, sensors 339, first gas supply system 345, curing (hardening) gas supply system 355, pressure control system 335, power source 360, and DC power source 385. One or more programs stored in the memory can be utilized to interact with the aforementioned components of the Q-NB curing (hardening) system 300 according to stored process recipes.

The plurality of controllers 395 may be implemented as a general-purpose computer system that performs a portion or all of the microprocessor based processing steps of the invention in response to a controller/processor executing one or more sequences of one or more instructions contained in a memory. Such instructions may be read into the controller memory from another computer readable medium, such as a hard disk or a removable media drive. One or more processors in a multi-processing arrangement may also be employed as the control microprocessor to execute the sequences of instructions contained in main memory. In alternative embodiments, hard-wired circuitry may be used in place of or in combination with software instructions. Thus, embodiments are not limited to any specific combination of hardware circuitry and software.

When a curing (hardening) process is performed by the Q-NB curing (hardening) system 300, the gate valve 302 can be opened, and a patterned substrate 325 to be cured is transferred into the curing (hardening) chamber 311 and placed on the substrate holder 320. The plasma generation subsystem 315 can provide a first plasma species and the curing (hardening) chamber 311 can be configured to use a first plasma species to facilitate the generation of curing (hardening) plasma 353 in curing (hardening) plasma region 352 adjacent a surface of the patterned substrate 325. The curing (hardening) plasma species can include a fluorocarbon element ($C_xF_y$), such as $C_4F_8$, and may contain another component, such as Ar, or CO. The flow rate for the first plasma species (ions) and/or electrons can be established using the curing (hardening) recipe. In addition, an ionizable curing (hardening) gas or mixture of curing (hardening) gases can introduced from the curing (hardening) gas supply system 355, and process pressure can be adjusted using pressure control system 335. For example, the pressure inside plasma generation chamber 316 can range from about 1 mtorr (millitorr) to about 1200 mtorr, and the pressure inside the curing (hardening) chamber 311 can range between about 0.1 mtorr and about 150 mtorr. In other examples, the pressure inside plasma generation chamber 316 can range from about 10 mtorr to about 150 mtorr, and the pressure inside the curing (hardening) chamber 311 can range between about 1 mtorr and about 15 mtorr.

In some other embodiments, while the first plasma species and the curing (hardening) gas is supplied into the curing (hardening) chamber 311, a controllable DC voltage can be applied from the DC power source 385 to the DC conductive bias electrode 382. Furthermore, another DC voltage can be applied from the clamping supply 322 to the electrostatic electrode 323 to fix the semiconductor substrate on the substrate holder 320. Radicals and ions generated in the curing (hardening) plasma 353 are used to cure the radiation-sensitive material (photoresist) layer on the patterned substrate 325.

When the radiation-sensitive material (photoresist) film on the patterned substrate 325 is an ArF resist film, the ArF resist film changes its polymer structure when it is radiated with electrons. When the composition of the ArF resist film is reformed due to the resist cross-linkage reaction, the etching resistance property of the ArF resist film increases. In addition, the surface roughness of the ArF resist film is decreased. Therefore, the applied power from the power source 360 and DC power source 385 can be controlled by the controller 395 to enhance the etching resistance property of the radiation-sensitive material (photoresist) film (particularly, ArF resist film) by irradiation with electrons.

One or more of the process sensors 339 may be disposed to detect the plasma state, so that the controller 395 can control the flow rate for the first plasma species and the other radiation-sensitive material (photoresist) curing (hardening) recipe parameters using the detected plasma state. For example, the DC power source 385 can be independently controlled when it is applied to the DC conductive bias electrode 382. In addition, one or more sensors 339 may be used to measure the plasma sheath length or the electron density.

Figure 4:
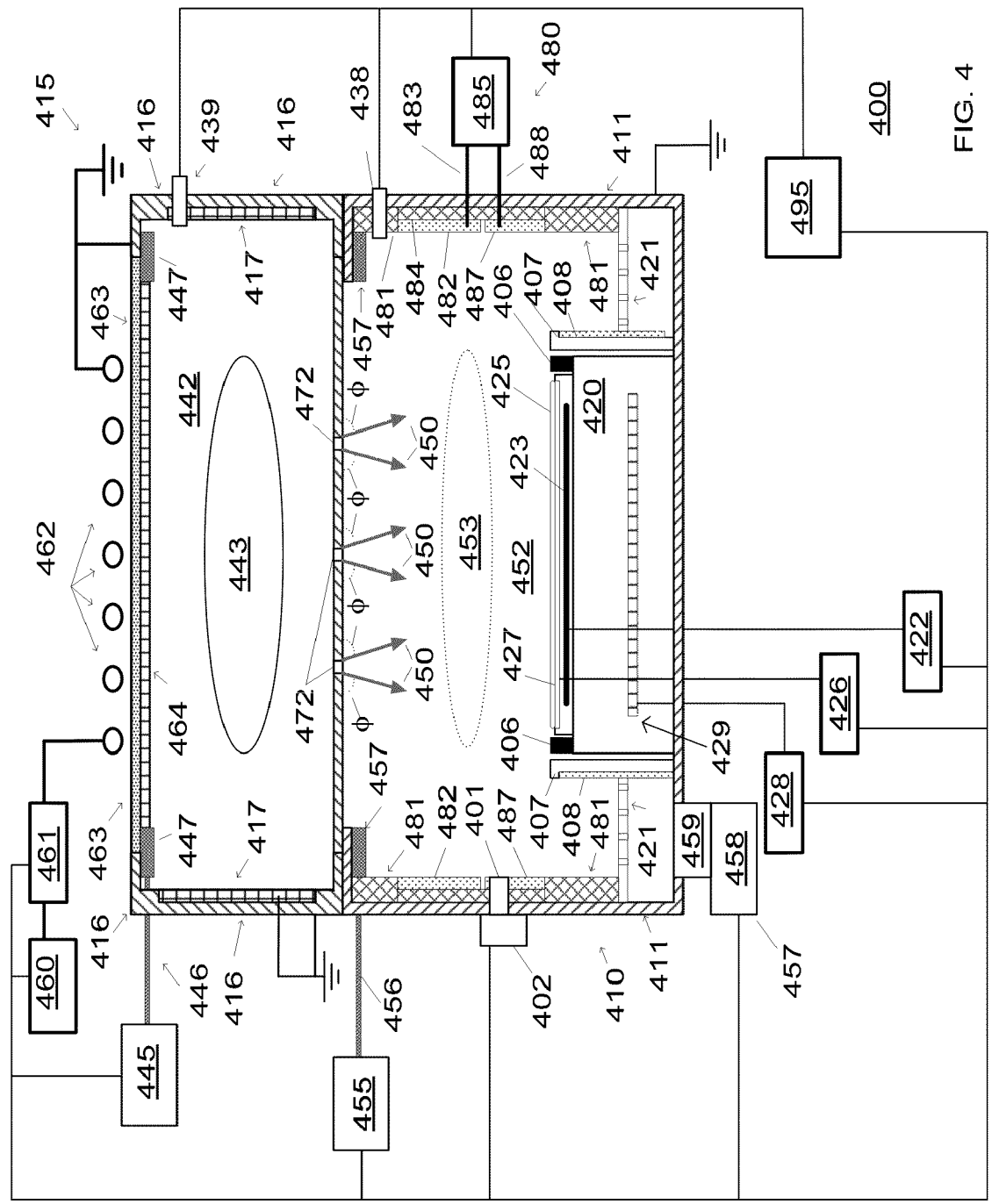
FIG. 4 shows an additional exemplary block diagram of a Q-NB curing (hardening) subsystem in accordance with embodiments of the invention.

FIG. 4 shows an exemplary block diagram of an additional Quasi-Neutral Beam (Q-NB) curing (hardening) subsystem in accordance with embodiments of the invention.

In the illustrated embodiment, an exemplary Q-NB curing (hardening) system 400 is shown, and the exemplary Q-NB curing (hardening) system 400 can comprise a plasma generation chamber 416 that can be configured to produce an upper plasma 443 at a first plasma potential, and a curing (hardening) chamber 411 that can be configured to provide a contaminant-free, vacuum environment for performing a Q-NB curing and/or hardening procedure using a patterned substrate 425. The Q-NB curing (hardening) subsystem 410 can include a substrate holder 420 configured to support the patterned substrate 425, and a pressure control system 435. In some examples, the pressure control system 435 can include a vacuum pump 436 and a gate valve 437 that can be coupled to the curing (hardening) chamber 411 and configured to evacuate the curing (hardening) chamber 411 and control a pressure in the curing (hardening) chamber 411. Alternatively, the pressure control system 435 can be configured using a different number of pumps and/or a different number of flow control devices.

The plasma generation chamber 416 can include an upper plasma region 442 that can be configured to receive a first process gas at a first pressure and can be configure to form an upper plasma 443. The curing (hardening) chamber 411 can include a curing (hardening) plasma region 452 disposed downstream of the upper plasma region 442. The curing (hardening) chamber 411 can be configured to receive electron flux and one or more plasma species from the upper plasma region 442 and form curing (hardening) plasma 453 therein at a curing (hardening) plasma potential and a second pressure. For example, the separation member 470 can include a plurality of openings 472, and each of the openings 472 can be configured to create a beam 450 that can have a beam angle ($\phi$). The beam angle ($\phi$) can vary from approximately 80 degrees to approximately 89.5 degrees.

A first gas injection system 445 can be coupled to one or more first gas distribution elements 447 using at least one first supply line 446. The first gas distribution element 447 can be configured within the plasma generation chamber 416 and can be used to introduce the first process gas to the upper plasma region 442. Alternatively, a different introduction method may be used. The first process gas can comprise an electropositive gas, or an electronegative gas, or a mixture thereof. For example, the first process gas may comprise a noble gas, such as argon (Ar). Additionally, for example, the first process gas may comprise any gas suitable for performing a Q-NB curing and/or hardening procedure using the patterned substrate 425. In addition, the first process gas may comprise any gas having chemical constituents, atomic or molecular, suitable for performing a Q-NB curing and/or hardening procedure using the patterned substrate 425. These chemical constituents may comprise etchants, film-forming gases, dilutants, cleaning gases, etc. The first gas injection system 445 can include one or more gas supplies or gas sources, one or more control valves, one or more filters, one or more mass flow controllers, one or more measurement devices, etc. The first supply line 446 and/or the first gas distribution element 447 can one or more control valves, one or more filters, one or more mass flow controllers, etc.

An optional curing (hardening) gas supply system 455 can be coupled to a curing (hardening) gas distribution element 457 using at least one second supply line 456. The curing (hardening) gas distribution element 457 can be configured within the curing (hardening) chamber 411 and can be used to introduce at least one curing (hardening) gas to the curing (hardening) plasma region 452. Alternatively, a different introduction method may be used. The curing (hardening) gas may comprise any gas suitable for performing a Q-NB curing and/or hardening procedure using the patterned substrate 425. Additionally, for example, the curing (hardening) gas may comprise any gas having chemical constituents, atomic or molecular, suitable for performing a Q-NB curing and/or hardening procedure using the patterned substrate 425. These chemical constituents may comprise etchants, film-forming gases, dilutants, cleaning gases, etc. The curing (hardening) gas supply system 455 may include one or more gas supplies or gas sources, one or more control valves, one or more filters, one or more mass flow controllers, one or more measurement devices, etc. The second supply line 456 and/or the curing (hardening) gas distribution element 457 can one or more control valves, one or more filters, one or more mass flow controllers, etc.

In various embodiments, the plasma species associated with the first gas injection system 445 can include Argon (Ar), $CF_4$, $F_2$, $C_4F_8$, CO, $C_5F_8$, $C_4F_6$, $CHF_3$, $N_2/H_2$, or HBr, or any combination of two or more thereof. The plurality of first gas distribution elements 447 can provide different flow rates to different regions of the upper plasma region 442. In addition, the plasma species associated with the curing (hardening) gas supply system 455 can include Argon (Ar), $CF_4$, $F_2$, $C_4F_8$, CO, $C_5F_8$, $C_4F_6$, $CHF_3$, $N_2/H_2$, or HBr, or any combination of two or more thereof. The plurality of curing (hardening) gas distribution elements 457 can provide different flow rates to different regions of the curing (hardening) plasma region 452.

When the first process gas and or the curing (hardening) gas includes at least one fluorocarbon gas and at least one inert gas, a first fluorocarbon gas flow rate varying between approximately 10 sccm and approximately 50 sccm and a first inert gas flow rate varying between approximately 3 sccm and approximately 20 sccm, and the fluorocarbon gas comprises $C_4F_6$, $C_4F_8$, $C_5F_8$, $CHF_3$, or $CF_4$, or any combination thereof, and the inert gas comprises Argon (Ar), Helium (He), Krypton (Kr), Neon (Ne), Radon (Rn), or Xenon (Xe), or any combination thereof.

When the first process gas and or the curing (hardening) gas includes CO, the CO flow rate can vary between approximately 2 sccm and approximately 20 sccm.

In addition, the exemplary Q-NB curing (hardening) system 400 can comprise a RF power source 460 and at least one multi-turn inductive coil 462 that can be mounted above the upper plasma region 442. The RF power source 460 can include a radio frequency (RF) generator that couples RF power through an impedance match network 461 to the at least one multi-turn inductive coil 462. For example, the RF power from the RF power source 460 can range from approximately 200 watts to approximately 10000 watts. RF power is inductively coupled from the multi-turn inductive coil 462 through a dielectric window 463 to the upper plasma 443 in the upper plasma region 442. The impedance match network 461 can be used to improve the transfer of RF power to plasma by reducing the reflected power. Match network topologies (e.g. L-type, u-type, T-type, etc.) and automatic control methods are well known to those skilled in the art.

In various embodiments, the frequency for the application of RF power to the multi-turn inductive coil 462 can range from about 10 MHz to about 100 MHz. In addition, a slotted Faraday shield 464 can be employed to reduce capacitive coupling between the multi-turn inductive coil 462 and plasma. Although the upper plasma may be heated by any plasma source, it is desired that the upper plasma be heated by a method, as previously shown in FIG. 2A and FIG. 2B, that produces a minimum fluctuation in its plasma potential ($V_{p,u}$).

In alternate embodiments, a different plasma generation system (not shown) can be coupled to the plasma generation chamber 416 and configured to generate the upper plasma 443 in the upper plasma region 442. The different plasma generation system may include a system configured to produce a capacitively coupled plasma (CCP), an inductively coupled plasma (ICP), a transformer coupled plasma (TCP), a surface wave plasma, a helicon wave plasma, or an electron cyclotron resonant (ECR) heated plasma, or other type of plasma understood by one skilled in the art of plasma formation. In addition, any ICP source can be used that produces a reduced or a minimum ($V_{p,u}$) fluctuation.

As an example, in an electropositive discharge, the electron density may range from approximately $10^{10}$ $cm^{-3}$ to $10^{13}$ $cm^{-3}$, and the electron temperature may range from about 1 eV to about 10 eV (depending on the type of plasma source utilized).

Still referring to FIG. 4, the plasma generation subsystem 415 can include a plasma generation chamber 416 that can include a direct current (DC) conductive electrode 417 having a conductive surface that acts as a boundary in contact with the upper plasma 443. The DC conductive ground electrode 417 is coupled to DC ground. For example, the DC conductive ground electrode 417 may comprise a doped silicon electrode. The DC conductive ground electrode 417 acts as an ion sink that is driven by the upper plasma 443 at an upper plasma potential ($V_{p,u}$). Although a single DC conductive ground electrode 417 is shown in FIG. 4, the Q-NB curing (hardening) system 400 may comprise one or more DC conductive ground electrodes.

Although not necessary, it is desirable that the DC conductive ground electrode 417 comprises a relatively large area in contact with the upper plasma 443. The larger the area at DC ground, the lower the upper plasma potential. For example, the surface area of the conductive surface for the DC conductive ground electrode 417 in contact with the upper plasma 443 may be greater than any other surface area in contact with the upper plasma 443. Additionally, for example, the surface area of the conductive surface for the DC conductive ground electrode 417 in contact with the upper plasma 443 may be greater than the total sum of all other conductive surfaces that are in contact with the upper plasma 443. Alternatively, as an example, the conductive surface for the DC conductive ground electrode 417 in contact with the upper plasma 443 may be the only conductive surface that is in contact with the upper plasma 443. The DC conductive ground electrode 417 may offer the lowest impedance path to ground.

In addition, the Q-NB curing (hardening) subsystem 410 can comprise a bias electrode system 480 coupled to the curing (hardening) chamber 411. The bias electrode system 480 can be configured to elevate the curing (hardening) plasma potential to a value above the upper plasma potential in order to drive the electron flux in the correct direction. The bias electrode system 480 can include one or more first DC conductive bias electrodes 482 that have at least one first conductive surface in contact with the curing (hardening) plasma 453, and one or more second DC conductive bias electrodes 487 that have at least one second conductive surface in contact with the curing (hardening) plasma 453. The DC conductive bias electrodes (482 and 487) can be electrically insulated from the curing (hardening) chamber 411 using at least one insulator 484 and the DC conductive bias electrodes (482 and 487) can be coupled to a DC power source 485. The conductive bias electrodes (482 and 487) can be composed of a conductive material, such as metal or doped silicon.

Although not necessary, it is desirable that the DC conductive bias electrodes (482 and 487) comprise a relatively large area in contact with the curing (hardening) plasma 453. The larger the area at the +VDC potential, the closer the curing (hardening) plasma potential will be to +VDC. As an example, the total area of the DC conductive bias electrodes (482 and 487) can be greater than the total sum of all other conductive surfaces that are in contact with the curing (hardening) plasma 453. Alternatively, as an example, the total area of the DC conductive bias electrodes (482 and 487) may be the only conductive surface that is in contact with the curing (hardening) plasma 453.

The DC power source 485 can include a variable DC power supply. Additionally, the DC power source 485 can include a bipolar DC power supply. The DC power source 485 can further include a system configured to perform at least one of monitoring adjusting, or controlling the polarity, current, voltage, or on/off state of the DC power source 485. An electrical filter may be utilized to de-couple RF power from the DC power source 485.

For example, the DC voltage applied to the DC conductive bias electrodes (482 and 487) by DC power source 485 may range from approximately 0 volts (V) to approximately 10000 V. Desirably, the DC voltage applied to the DC conductive bias electrodes (482 and 487) by DC power source 485 may range from approximately 50 volts (V) to approximately 5000 V. Additionally, it is desirable that the DC voltage has a positive polarity. Furthermore, it is desirable that the DC voltage is a positive voltage having an absolute value greater than approximately 50 V.

As shown in FIG. 4, the curing (hardening) chamber 411 can include one or more chamber housing members that may be coupled to ground. Additionally, a liner member 481 can be disposed between one or more of the walls of the curing (hardening) chamber 411 and the curing (hardening) plasma 453. For example, each liner member 481 can be fabricated from a dielectric material, such as quartz or alumina, and the liner member 481 can provide a high RF impedance to ground for the curing (hardening) plasma 453.

In addition, the Q-NB curing (hardening) system 400 can include at least one separation member 470 that can be configured between the upper plasma region 442 and the curing (hardening) plasma region 452. The separation member 470 can include one or more openings 472 that can be configured to create a plurality of beams 350 that can include at least one plasma species as well as an electron flux from the upper plasma 443 in the upper plasma region 442 to the curing (hardening) plasma region 452. For example, the electrons and/or ions in the plurality of beams 450 can be used to form the curing (hardening) plasma 453 in the curing (hardening) plasma region 452.

One or more of the openings 472 in the separation member 470 can comprise a super-Debye length apertures, i.e., the transverse dimension or diameter is larger than the Debye length. The openings 472 can be sufficiently large to permit adequate electron transport, and the openings 472 may be sufficiently small to allow a sufficiently high potential difference between the upper plasma potential and the curing (hardening) plasma potential and to reduce any reverse ion current between the curing (hardening) plasma 453 and the upper plasma 443. Further, the one or more openings 472 may be sufficiently small to sustain a pressure difference between the first pressure in the upper plasma region 442 and the second pressure in the curing (hardening) plasma region 452.

Although the DC conductive ground electrode 417 is coupled to DC ground, it may be coupled to a DC voltage less than the bias DC voltage coupled to the DC conductive bias electrodes (482 and 487).

As illustrated in FIG. 4, the plurality of beams 450 can include an electron flux that occurs between the upper plasma region 442 and the curing (hardening) plasma region 452 through separation member 370. The electron transport is driven by electric field-enhanced diffusion, wherein the electric field is established by the potential difference between the first plasma potential and the curing (hardening) plasma potential. The plurality of beams 450 can include an electron flux that can be sufficiently energetic to sustain ionization in the curing (hardening) plasma 453.

Pressure control system 435 can include a pump 436 that can be a turbo-molecular vacuum pump (TMP) capable of a pumping speed up to 5000 liters per second (and greater) and a vacuum valve 437 (or second vacuum valve), such as a gate valve, for controlling the pressure in the curing (hardening) plasma region 452. Furthermore, one or more sensors 439 for monitoring chamber conditions can be coupled to the curing (hardening) chamber 411, and one or more of the sensors 439 can be used to measure pressure in the curing (hardening) chamber 411.

In some embodiments, the Q-NB curing (hardening) subsystem 410 can include a substrate holder 420 that can be coupled to ground. If the substrate holder 420 is coupled to ground, the patterned substrate 425 can be at floating ground, and therefore, the only ground the curing (hardening) plasma 453 contacts is the floating ground provided by patterned substrate 425. For example, when the patterned substrate 425 is clamped to substrate holder 420, a ceramic electrostatic clamp (ESC) layer may insulate the patterned substrate 425 from the grounded substrate holder 420.

Referring still to FIG. 4, the Q-NB curing (hardening) subsystem 410 can include a substrate temperature control system 428 coupled to the substrate holder 420 and configured to adjust and control the temperature of patterned substrate 425. The substrate temperature control system 428 can include temperature control elements 429 configured to control the temperature of the patterned substrate. Alternatively, temperature control elements (not shown) can be configured in a chamber wall of the curing (hardening) chamber 411 and/or any other component within the Q-NB curing (hardening) subsystem 410.

In order to improve the thermal transfer between the patterned substrate 425 and substrate holder 420, the substrate holder 420 can include electrostatic clamping (ESC) electrode 423 that can be coupled to a clamping supply 422 to affix the patterned substrate 425 to an upper surface of substrate holder 420. In some embodiments, the electrostatic clamping (ESC) electrode 423 can be used to isolate the patterned substrate 425 from the grounded substrate holder 420.

Furthermore, substrate holder 420 can further include backside gas elements 427 that can be coupled to a backside gas delivery system 426 that can be configured to introduce gas to the backside of the patterned substrate 425 in order to improve the gas-gap thermal conductance between the patterned substrate 425 and substrate holder 420. Such a system can be utilized when temperature control of the patterned substrate 425 is required at elevated or reduced temperatures. For example, the substrate backside gas delivery system 426 can be coupled to a two-zone (center/edge) backside gas elements 427, wherein the helium gas gap pressure can be independently varied between the center and the edge of the patterned substrate 425. In other embodiments, the backside gas elements 427 can be used to isolate the patterned substrate 425 from the grounded substrate holder 420.

In addition, the substrate holder 420 may be surrounded by a baffle member 421 that extends beyond a peripheral edge of the substrate holder 420. The baffle member 421 may serve to homogeneously distribute the pumping speed delivered by the pressure control system 435 to the curing (hardening) plasma region 452. The baffle member 421 may be fabricated from a dielectric material, such as quartz, or alumina. The baffle member 421 may provide a high impedance to ground for the curing (hardening) plasma 453.

A transfer port 401 for a semiconductor substrate is formed in the sidewall of the curing (hardening) chamber 411, and can be opened/closed by a gate valve 402 attached thereon. One or more of the controllers 495 can be coupled to gate valve 402 and can be configured to control gate valve 402. The patterned substrate 425 can be, for example, transferred into and out of curing (hardening) chamber 411 through transfer port 401 and gate valve 402 from a transfer subsystem (170, FIG. 1), and it can be received by substrate lift pins (not shown) housed within substrate holder 420 and mechanically translated by devices (not show) housed therein. After the patterned substrate 425 is received from transfer system, it can be lowered to an upper surface of substrate holder 420. The design and implementation of substrate lift pins is well known to those skilled in the art. Alternatively, an un-patterned substrate may be used.

In some embodiments, a conductive focus ring 406 can be used, and the conductive focus ring 406 can include a silicon-containing material and can be disposed on the top of the substrate holder 420. In some examples, conductive focus ring 406 can be configured to surround the electrostatic electrode 423, the backside gas elements 427, and the patterned substrate 425 to improve uniformity at the edge of the substrate. In other examples, the conductive focus ring 406 can include a correction ring portion (not shown) that can be used to modify the edge temperature of the patterned substrates 425. Alternatively, a non-conductive focus ring may be used.

In other embodiments, an inner deposition shield 408 can be detachably coupled to the substrate holder 420 to prevent by-products created during curing and/or hardening procedures from being deposited on the substrate holder 420. In addition, an outer deposition shield (not shown) can be detachably coupled along one or more of the inner walls of the curing (hardening) chamber 411 to prevent by-products created during curing and/or hardening procedures from being deposited on the wall. For example, the outer deposition shield can be configured as a part of a chamber wall. The baffle member 421 and the deposition shield 408 can include an aluminum body covered with a ceramic, such as $Y_2O_3$. The gate valve 437 can be coupled to an exhaust space formed at the bottom of the curing (hardening) chamber 411.

As depicted in FIG. 4, the Q-NB curing (hardening) subsystem 410 can include one or more first process sensors 438 coupled to the upper plasma region 442 and one or more second process sensors 439 coupled to the curing (hardening) plasma region 452. Alternatively, the number and position of the process sensors (438, 439) may be different. In various embodiments, the first process sensors 438 can include one or more optical devices for monitoring the light emitted from the upper plasma 443 in the upper plasma region 442, and the second process sensors 439 can include one or more optical devices for monitoring the light emitted from the curing (hardening) plasma 453 in the curing (hardening) plasma region 452. For example, one or more Optical Emission Spectroscopy (OES) sensors may be used, and the OES data can be used as ignition data, operational data, or endpoint data.

One or more of the process sensors (438, 439) can include gas-sensing devices for monitoring and/or controlling input gasses, process gasses, and/or exhaust gasses. In addition, the one or more of the process sensors (438, 439) can include pressure sensors, temperature sensors, current and/or voltage probes, power meters, spectrum analyzers, or an RF Impedance analyzer, or any combination thereof.

In addition, the Q-NB curing (hardening) subsystem 410 can include one or more internal sensors (not shown), and the internal sensors can include those sensors pertaining to the functionality of curing (hardening) chamber 411, such as the measurement of the Helium backside gas pressure, Helium backside flow, electrostatic clamping (ESC) voltage, ESC current, substrate holder temperature (or lower electrode (LEL) temperature), coolant temperature, DC conductive bias electrode temperature, forward RF power, reflected RF power, electrode DC bias, RF peak-to-peak voltage, chamber wall temperature, process gas flow rates, process gas partial pressures, matching network settings, a focus ring thickness, RF hours, focus ring RF hours, and any statistic thereof.

Controller 495 can include one or more microprocessors, one or more memory elements, and one or more analog and/or digital I/O devices (potentially including D/A and/or ND converters) capable of generating control voltages sufficient to communicate and activate inputs to the Q-NB curing (hardening) system 400 as well as monitor outputs from Q-NB curing (hardening) system 400. As shown in FIG. 4, controller 495 can be coupled to and exchange information with gate valve 402, a clamping supply 422, backside gas delivery system 426, temperature control system 428, sensors 439, first gas supply system 445, curing (hardening) gas supply system 455, pressure control system 435, power source 460, and DC power source 485. One or more programs stored in the memory can be utilized to interact with the aforementioned components of the Q-NB curing (hardening) system 400 according to stored process recipes. In addition, one or more first electrical supply elements 483 can be configured to allow electrical connection to the first DC conductive bias electrode 482, and one or more second electrical supply elements 488 can be configured to allow electrical connection to the second DC conductive bias electrode 487.

The plurality of controllers 495 may be implemented as a general-purpose computer system that performs a portion or all of the microprocessor based processing steps of the invention in response to a controller/processor executing one or more sequences of one or more instructions contained in a memory. Such instructions may be read into the controller memory from another computer readable medium, such as a hard disk or a removable media drive. One or more processors in a multi-processing arrangement may also be employed as the control microprocessor to execute the sequences of instructions contained in main memory. In alternative embodiments, hard-wired circuitry may be used in place of or in combination with software instructions. Thus, embodiments are not limited to any specific combination of hardware circuitry and software.

When a curing and/or hardening process is performed by the Q-NB curing (hardening) system 400, the gate valve 402 can be opened, and a patterned substrate 425 to be cured is transferred into the curing (hardening) chamber 411 and placed on the substrate holder 420. The plasma generation subsystem 415 can provide a upper plasma species and the curing (hardening) chamber 411 can be configured to use a upper plasma species to facilitate the generation of curing (hardening) plasma 453 in curing (hardening) plasma region 452 adjacent a surface of the patterned substrate 425. The curing (hardening) plasma species can include a fluorocarbon element ($C_xF_y$), such as $C_4F_8$, and may contain another component, such as Ar, or CO. The flow rate for the upper plasma species and/or the electrons can be established using the curing (hardening) recipe. In addition, an ionizable curing (hardening) gas or mixture of curing (hardening) gases can introduced from the curing (hardening) gas supply system 455, and process pressure can be adjusted using pressure control system 435. For example, the pressure inside plasma generation chamber 416 can range from about 1.0 mtorr (millitorr) to about 1200 mtorr, and the pressure inside the curing (hardening) chamber 411 can range between about 0.1 mtorr and about 150 mtorr. In other examples, the pressure inside plasma generation chamber 416 can range from about 10 mtorr to about 150 mtorr, and the pressure inside the curing (hardening) chamber 411 can range between about 1 mtorr and about 15 mtorr.

In some other embodiments, while the upper plasma species and the curing (hardening) gas is supplied into the curing (hardening) chamber 411, independently controllable DC voltages can be applied from the DC power source 485 to the DC conductive bias electrodes (482 and 487). Furthermore, another DC voltage can be applied from the clamping supply 422 to the electrostatic electrode 423 to fix the semiconductor substrate on the substrate holder 420. Radicals and ions generated in the curing (hardening) plasma 453 are used to cure the radiation-sensitive material (photoresist) layer on the patterned substrate 425.

When the radiation-sensitive material (photoresist) film on the patterned substrate 425 is an ArF resist film, the ArF resist film changes its polymer structure when it is radiated with electrons. When the composition of the ArF resist film is reformed due to the resist cross-linkage reaction, the etching resistance property of the ArF resist film increases. In addition, the surface roughness of the ArF resist film is decreased. Therefore, the applied power from RF source 460 and DC power source 485 can be controlled by the controller 495 to enhance the etching resistance property of the radiation-sensitive material (photoresist) film (particularly, ArF resist film) by irradiation with electrons.

One or more of the process sensors 439 may be disposed to detect the plasma state, so that the controller 495 can control the flow rate for the first plasma species and the other radiation-sensitive material (photoresist) curing (hardening) recipe parameters using the detected plasma state. In addition, one or more sensors 439 may be used to measure the plasma sheath length or the electron density.

Figure 5:
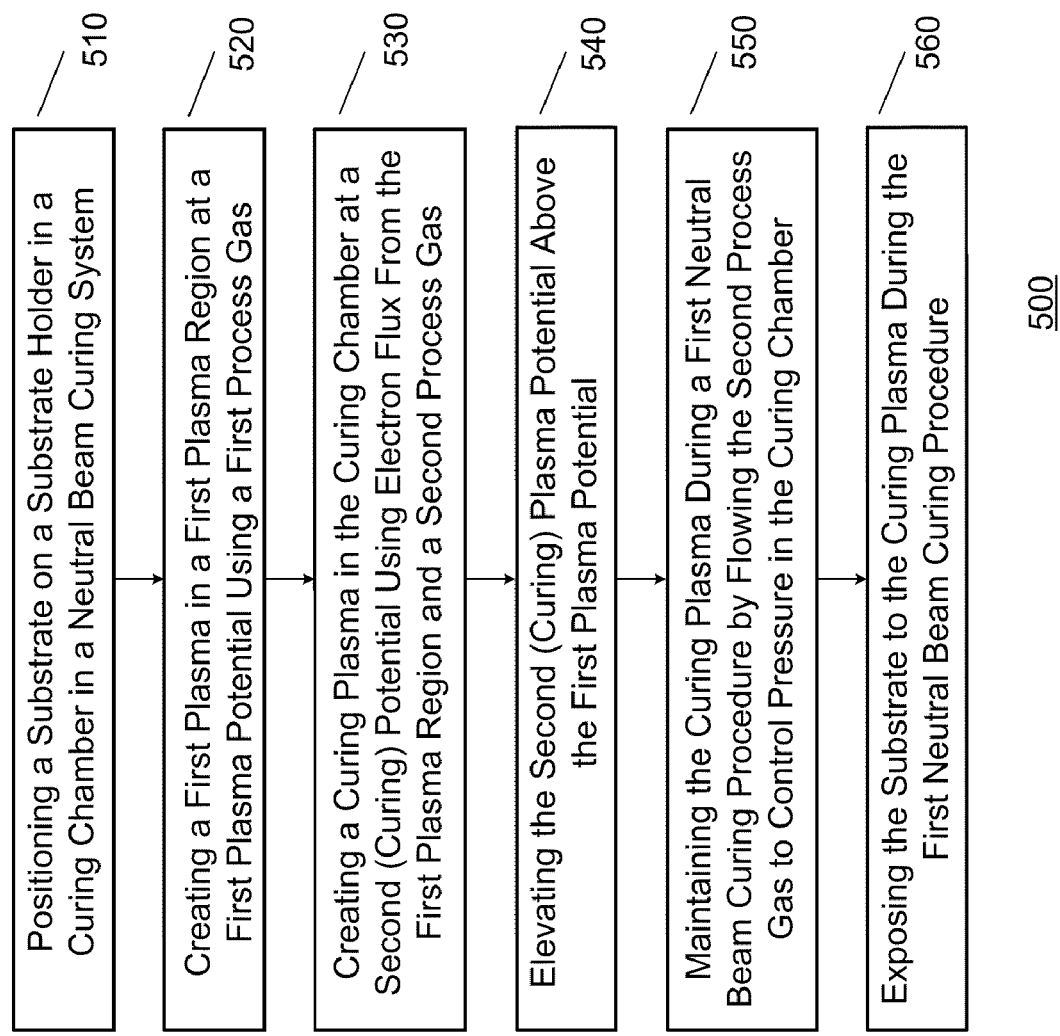
FIG. 5 shows an exemplary flow diagram of a method for operating a Q-NB curing (hardening) subsystem in accordance with embodiments of the invention.

FIG. 5 shows an exemplary flow diagram of a Q-NB curing and/or hardening procedure in accordance with embodiments of the invention. In the illustrated embodiment, a procedure 500 is provided of a method for curing and/or hardening an un-patterned and/or a patterned deposited layer on a substrate using a Q-NB curing (hardening) system such as shown in FIGS. 2A, 2B, 3, and 4.

In 510, a substrate can be position on a substrate holder in a curing (hardening) chamber in a Q-NB curing (hardening) system that can be configured to cure and/or harden an un-patterned and/or a patterned layer on a substrate using curing (hardening) plasma. The curing (hardening) chamber may include components of any one of the Q-NB curing (hardening) systems described herein. The substrate can have one or more deposited layers thereon, and the deposited layers can include Anti-Reflective Coating (ARC) material, Bottom Anti-Reflective Coating (BARC) material, Top Anti-Reflective Coating (TARC) material, single-frequency resist material, dual-tone resist material, freezable or frozen resist material, Ultra-Violet (UV) resist material, or Extreme Ultra-Violet (EUV) resist material, or any combination thereof. For example, during some Q-NB curing and/or hardening procedures, the substrate can have at least one un-exposed layer thereon, and during other Q-NB curing and/or hardening procedures, the substrate can have at least one exposed layer thereon. When the Q-NB curing and/or hardening procedures are performed during double-exposure sequences, different Q-NB curing and/or hardening recipes can be used during the different exposure procedures.

In 520, first (upper) plasma can be created using a first process gas in a first (upper) plasma region at a first plasma potential. As illustrated in FIGS. 2A, 2B, 3, and 4, the first (upper) plasma region may be located in a plasma generation chamber, and a plasma generation system may be coupled to the plasma generation chamber in order to form the first (upper) plasma. A first process gas can be provided to the plasma generation chamber, and the flow rate for the first process gas can be monitored and controlled to optimize the first (upper) plasma. In some alternate embodiments, the first (upper) plasma can be created before and/or while the substrate is being positioned on the substrate holder. For example, the first (upper) plasma may be in a lower power mode during substrate transfers.

In 530, curing (hardening) plasma is formed in a curing (hardening) plasma region at a second curing (hardening) plasma potential using electron flux from the first plasma. Electron flux from the first plasma in the first plasma region passes from the plasma generation chamber through a separation member to a curing (hardening) chamber where the curing (hardening) plasma is created. A second process gas can be provided to the curing (hardening) plasma chamber, and the flow rate for the second process gas can be monitored and controlled to optimize the second curing (hardening) plasma. As illustrated in FIGS. 2A, 2B, 3, and 4, the curing (hardening) plasma region can be located in the curing (hardening) chamber, wherein one or more openings or passages in the separation member disposed between the plasma generation chamber and the curing (hardening) chamber facilitate the transport or supply of electrons from the first plasma region to the curing (hardening) plasma region.

In 540, the second curing (hardening) plasma potential can be elevated above the first plasma potential to control the electron flux. The first plasma in the first plasma region may be a boundary-driven plasma (i.e., the plasma boundary has a substantive influence on the respective plasma potential), wherein part or the entire boundary in contact with the first plasma is coupled to DC ground. Additionally, the curing (hardening) plasma in the curing (hardening) plasma region may be a boundary-driven plasma, wherein part or the entire boundary in contact with the curing (hardening) plasma is coupled to a DC power source at +VDC. The elevation of the second curing (hardening) plasma potential above the first (upper) plasma potential may be performed using any one or combination of the embodiments provided in FIGS. 2A, 2B, 3, and 4.

In 550, the curing (hardening) plasma can be maintained during a first Q-NB curing and/or hardening procedure. For example, the pressure in the curing (hardening) chamber can be controlled by pumping the curing (hardening) chamber and controlling the flow rate for the second process gas entering the curing (hardening) chamber.

In 560, the substrate can be exposed to the curing (hardening) plasma in the curing (hardening) plasma region during the first Q-NB curing (hardening) procedure. The exposure of the substrate to the curing (hardening) plasma may comprise exposing the substrate to a mono-energetic space-charge neutralized Q-NB activated chemical process.

Figure 6:
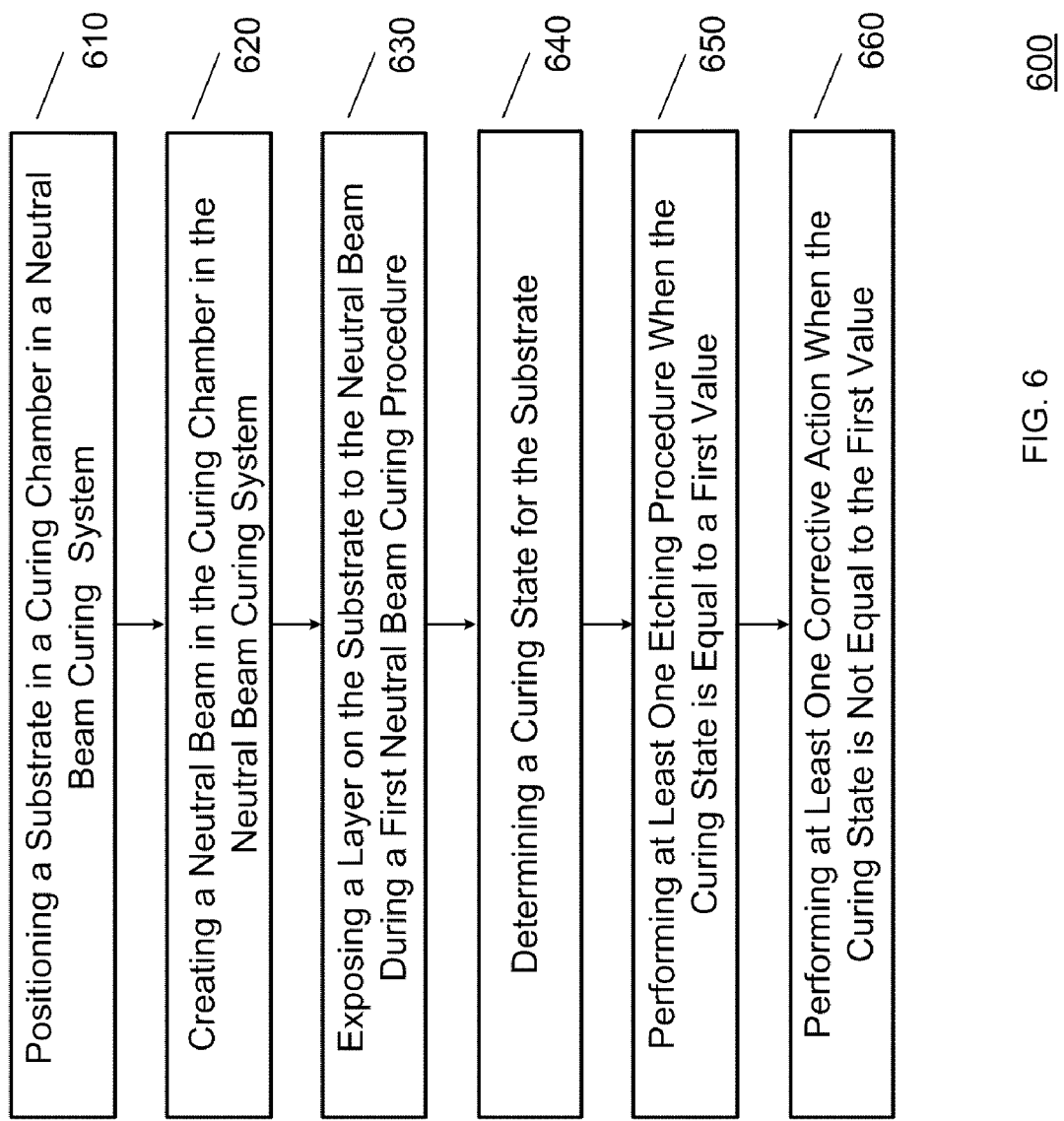
FIG. 6 shows an exemplary flow diagram of another method for operating a Q-NB curing (hardening) subsystem in accordance with embodiments of the invention.

FIG. 6 shows an exemplary flow diagram of another method for operating a Q-NB curing (hardening) subsystem in accordance with embodiments of the invention. In the illustrated embodiment, a procedure 600 is provided for a method of curing and/or hardening an un-patterned and/or a patterned layer on a substrate using a Q-NB curing (hardening) system such as shown in FIGS. 2A, 2B, 3, and 4.

In 610, a substrate can be position on a substrate holder in a curing (hardening) chamber in a Q-NB curing (hardening) system that can be configured to cure, freeze, and/or harden an un-patterned and/or a patterned layer on a substrate using curing (hardening) plasma. The curing (hardening) chamber may include components of any one of the Q-NB curing (hardening) systems described herein. The substrate can have one or more deposited layers thereon, and the deposited layers can include Anti-Reflective Coating (ARC) material, Bottom Anti-Reflective Coating (BARC) material, Top Anti-Reflective Coating (TARC) material, single-frequency resist material, dual-tone resist material, freezable or frozen resist material, Ultra-Violet (UV) resist material, or Extreme Ultra-Violet (EUV) resist material, or any combination thereof.

In some embodiments, a first set of un-patterned substrates can be received by a transfer subsystem (170, FIG. 1) that can be coupled to a Q-NB curing (hardening) subsystem (150, FIG. 1). Each un-patterned substrate can have at least one un-patterned masking layer that can be cured, frozen, and/or hardened by the Q-NB curing (hardening) subsystem (150, FIG. 1) before the un-patterned substrate is further processed by one or more of the subsystems (110, 120, 130, 140, 150, 160, and 170) in the processing system 100.

In other embodiments, a first set of patterned substrates can be received by a transfer subsystem (170, FIG. 1) that can be coupled to a Q-NB curing (hardening) subsystem (150, FIG.

1). Each patterned substrate can have at least one patterned masking layer thereon that can be cured, frozen, and/or hardened by the Q-NB curing (hardening) subsystem (150, FIG. 1) before the patterned substrate is further processed by one or more of the subsystems (110, 120, 130, 140, 150, 160, and 170) in the processing system 100. For example, during some Q-NB curing and/or hardening procedures, the patterned substrate can have at least one exposed masking layer thereon, and during other Q-NB curing and/or hardening procedures, the substrate can have at least one developed masking layer thereon. When some Q-NB curing and/or hardening procedures are performed, a plurality of cured, frozen, and/or hardened masking structures and/or periodic structures can be created.

When measurement data is required, one or more of the processed substrates can be transferred to the evaluation subsystem (160, FIG. 1), and measurement data can be obtained for the processed substrate using diffraction signal data from at least one of the plurality of cured, frozen, and/or hardened masking structures and/or periodic structures. In addition, risk data and/or confidence data for the processed substrates can be determined by comparing the measurement data to one or more Q-NB curing (hardening) limits and/or thresholds. For example, when the risk data is not less than a first risk limit for a Q-NB curing and/or hardening procedure, one or more corrective actions can be performed.

One or more of the controllers (114, 124, 134, 144, 154, 164, and 190) can be used to receive, determine, and/or send real-time and/or historical data associated with one or more of the first set of un-patterned and/or patterned substrates. For example, the real-time and/or historical data can include material data for patterned and/or un-patterned masking layers, metrology data for the gate-related masking features, and metrology data for the at least one periodic evaluation structure. In addition, the metrology data can include profile data, diffraction signal data, CD data, and SWA data that can be used to establish limits for the Q-NB curing and/or hardening procedure.

In 620, a Q-NB can be created in the curing (hardening) chamber of a Q-NB curing (hardening) system that can be configured to cure and/or harden an un-patterned and/or a patterned layer on a substrate using curing (hardening) plasma. In some embodiments, first (upper) plasma can be created at a first plasma potential in a plasma generation chamber using a first process gas and a plasma generation system that can provide RF power when the first (upper) plasma is formed. The RF power and the flow rate for the first process gas can be monitored and controlled to optimize the first (upper) plasma.

In addition, curing (hardening) plasma can be formed in a curing (hardening) plasma region at a second curing (hardening) plasma potential using electron flux from the first plasma. Electron flux from the first plasma in the first plasma region passes from the plasma generation chamber through a separation member to a curing (hardening) chamber where the curing (hardening) plasma is created. A second process gas can be provided to the curing (hardening) plasma chamber, and the flow rate for the second process gas can be monitored and controlled to optimize the second curing (hardening) plasma. The second curing (hardening) plasma potential can be elevated above the first plasma potential to control the electron flux. The first plasma in the first plasma region may be a boundary-driven plasma (i.e., the plasma boundary has a substantive influence on the respective plasma potential), wherein part or the entire boundary in contact with the first plasma is coupled to DC ground. Additionally, the curing (hardening) plasma in the curing (hardening) plasma region may be a boundary-driven plasma, wherein part or the entire boundary in contact with the curing (hardening) plasma is coupled to a DC power source at +VDC. The elevation of the second curing (hardening) plasma potential above the first (upper) plasma potential may be performed using any one or combination of the embodiments provided in FIGS. 2A, 2B, 3, and 4.

In 630, a first Q-NB curing and/or hardening procedure can be performed during which at least one layer on a substrate can be exposed to the previously created Q-NB. In some embodiments, one or more polymer components in the masking material in the at least one layer can be de-coupled and removed during the first Q-NB curing and/or hardening procedure thereby creating a plurality of cured, frozen, and/or hardened structures. A protecting group or a blocking group can be a polymer group that can be used to protect a functional group from unwanted reactions, and first Q-NB curing and/or hardening procedure can be used to remove the protecting group or the blocking group thereby revealing the original functional group. In other examples, one or more leaving groups can be removed from one or more polymer chains during the first Q-NB curing and/or hardening procedure and reflectivity data for the at least one layer can be changed. In still other examples, a blocking group and/or protecting group can be de-blocked and/or de-protected during the first Q-NB curing and/or hardening procedure.

In 640, a curing and/or hardening state can be determined and/or updated for the substrate while the first Q-NB curing and/or hardening procedure is being performed or after the first Q-NB curing and/or hardening procedure has been performed. For example, optical data can be used to determine the curing and/or hardening state. In other cases, endpoint data can be used to determine the curing and/or hardening state.

In 650, at least one etching procedure can be performed when the curing and/or hardening state is equal to a first value. For example, when the curing and/or hardening state and the first value can be expressed as percentages, the first value can be established at approximately ninety percent. In some examples, a Q-NB etching procedure can be performed using the Q-NB curing (hardening) system. In other examples, the substrate can be transferred to an etching subsystem where one or more etching procedures can be performed.

In 660, at least one corrective action can be performed when the curing and/or hardening state is not equal to a first value.

In some examples, corrective actions can include stopping the processing, pausing the processing, re-evaluating one or more of the substrates, re-measuring one or more of the substrates, re-inspecting one or more of the substrates, re-working one or more of the substrates, storing one or more of the substrates, cleaning one or more of the substrates, delaying one or more of the substrates, or stripping one or more of the substrates, or any combination thereof.

Corrective actions can include calculating new and/or updated Q-NB curing and/or hardening maps for the substrates. In addition, corrective actions can include increasing the number of required evaluation sites by one or more when one or more values in the Q-NB curing and/or hardening map are not within a limit; and decreasing the number of required evaluation sites by one or more when one or more values in the Q-NB curing and/or hardening map are within the limit.

In some examples, individual and/or total confidence values for the Q-NB curing and/or hardening procedure can be compared to individual and/or total confidence limits. The processing of a set of substrates can continue, if one or more of the confidence limits are met, or corrective actions can be applied if one or more of the confidence limits are not met. Corrective actions can include establishing confidence values for one or more additional substrates in the set of substrates, comparing the confidence values for one or more of the additional substrates to additional confidence limits; and either continuing the Q-NB curing and/or hardening procedure, if one or more of the additional confidence limits are met, or stopping the Q-NB curing and/or hardening procedure, if one or more of the additional confidence limits are not met.

In other examples, individual and/or total risk values for the substrate can be compared to individual and/or total risk limits. The processing of a set of substrates can continue, if one or more of the risk limits are met, or corrective actions can be applied if one or more of the risk limits are not met. Corrective actions can include establishing risk values for one or more additional substrates in the set of substrates, comparing the risk values for one or more of the additional substrates to additional risk limits; and either continuing the Q-NB curing and/or hardening procedure, if one or more of the additional risk limits are met, or stopping the Q-NB curing and/or hardening procedure, if one or more of the additional risk limits are not met.

FIG. 7 illustrates an exemplary view of a Quasi-Neutral Beam (Q-NB) curing and/or hardening procedure using a metal gate structure in accordance with embodiments of the invention. In the illustrated embodiment, two exemplary gate stacks (701 and 702) are shown, but this is not required for the invention. Alternatively, a different number of gates stacks, a different number of models, and different configurations may be used.

First gate stack 701 is shown that includes a substrate layer 710, a metal gate layer 715, a first hard mask layer 720, a first silicon-containing layer 725, a second silicon-containing layer 730, a second hard mask layer 735, a gate-width control layer 740, a third hard mask layer 745, and a pattern of soft mask features 750. For example, the substrate layer 710 can include a semiconductor material; the metal gate layer 715 can include $HfO_2$; the first hard mask layer 720 can include TiN; the first silicon-containing layer 725 can include amorphous silicon (a-Si); the second silicon-containing layer 730 can include SiN; the second hard mask layer 735 can include TEOS; the gate-width control layer 740 can include an etch control material; the third hard mask layer 745 can include silicon-containing anti-reflective coating (SiARC) material; and the soft mask features 750 can include radiation-sensitive material (photoresist) material.

Second gate stack 702 is shown that includes a substrate layer 710, a metal gate layer 715, a first hard mask layer 720, a first silicon-containing layer 725, a second silicon-containing layer 730, a second hard mask layer 735, a gate-width control layer 740, a third hard mask layer 745, and a pattern of hardened soft mask features 750a. For example, the substrate layer 710 can include a semiconductor material; the metal gate layer 715 can include $HfO_2$; the first hard mask layer 720 can include TiN; the first silicon-containing layer 725 can include amorphous silicon (a-Si); the second silicon-containing layer 730 can include SiN; the second hard mask layer 735 can include TEOS; the gate-width control layer 740 can include an etch control material; the third hard mask layer 745 can include SiARC material; and the hardened soft mask features 750a can include ArF photoresist material 751 and hardened ArF photoresist material 752.

In additional examples, one or more Q-NB curing and/or hardening procedures can be performed when the third hard mask layer 745 is further processed, when the gate-width control layer 740 is further processed, when the second hard mask layer 735 is further processed, when the second silicon-containing layer 730 is further processed, when the first silicon-containing layer 725 is further processed, when the first hard mask layer 720 is further processed, when the metal gate layer 715 is further processed, and when the substrate layer 710 is further processed.

In still other embodiments, one or more substrates can be processed using a verified Q-NB curing and/or hardening procedure. When a verified Q-NB curing and/or hardening procedure is used, one or more verified structures can be created on a substrate ("golden wafer"). When the substrate is examined, a test reference structure can be selected from a number of verified structures on the substrate. During the examination, examination data can be obtained from the test reference structure. A best estimate structure and associated best estimate data can be selected from the library data that is associated with the Q-NB curing and/or hardening procedure and that includes verified structures and associated data. One or more differences can be calculated between the test reference structure and the best estimate structure from the library, the differences can be compared to matching criteria, creation criteria, or product requirements, or any combination thereof. When matching criteria are used, the test reference structure can be identified as an existing member of the Q-NB curing and/or hardening library, and the current substrate can be identified as a reference "golden" substrate if the matching criteria are met or exceeded. When creation criteria are used, the test reference structure can be identified as a new member of the Q-NB curing and/or hardening library, and the current substrate can be identified as a verified reference substrate if the creation criteria are met. When product requirement data is used, the test reference structure can be identified as a verified structure, and the substrate can be identified as verified production substrate if one or more product requirements are met. Corrective actions can be applied if one or more of the criteria or product requirements are not met. Confidence data and/or risk data can be established for the Q-NB curing and/or hardening procedure using the test reference structure data and the best estimate structure data.

When structures are produced and/or examined during a Q-NB curing and/or hardening procedure, accuracy and/or tolerance limits can be used. When these limits are not correct, refinement procedures can be performed. Alternatively, other procedures can be performed, other sites can be used, or other substrates can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

In some embodiments, the library data associated with a Q-NB curing and/or hardening procedure can include goodness of fit (GOF) data, creation rules data, measurement data, inspection data, verification data, map data, confidence data, accuracy data, process data, or uniformity data, or any combination thereof.

In some embodiments, the historical and/or real-time data can include hardness-related maps, substrate-related maps, process-related maps, damage-assessment maps, reference maps, measurement maps, prediction maps, risk maps, inspection maps, verification maps, evaluation maps, particle maps, and/or confidence map(s) for one or more substrates. In addition, some Q-NB curing and/or hardening procedures may use substrate maps that can include one or more Goodness Of Fit (GOF) maps, one or more thickness maps, one or more gate-related maps, one or more Critical Dimension (CD) maps, one or more CD profile maps, one or more material related maps, one or more structure-related maps, one or more sidewall angle maps, one or more differential width maps, or a combination thereof.

When substrate maps are created and/or modified, values may not be calculated and/or required for the entire substrate, and a substrate map may include data for one or more sites, one or more chip/dies, one or more different areas, and/or one or more differently shaped areas. For example, a curing and/or hardening chamber may have unique characteristics that may affect the quality of the processing results in certain areas of the substrate. In addition, a manufacturer may allow less accurate process and/or evaluation data for chips/dies in one or more regions of the substrate to maximize yield. When a value in a map is close to a limit, the confidence value may be lower than when the value in a map is not close to a limit. In addition, the accuracy values can be weighted for different chips/dies and/or different areas of the substrate. For example, a higher confidence weight can be assigned to the accuracy calculations and/or accuracy data associated with one or more of the previously used evaluation sites.

In addition, process result, measurement, inspection, verification, evaluation, and/or prediction maps associated with one or more processes may be used to calculate a confidence map for a substrate. For example, values from another map may be used as weighting factors.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method for curing a deposited layer on a substrate using a Quasi-Neutral Beam (Q-NB) curing system, comprising:
    positioning the substrate on a substrate holder in a curing chamber in the Q-NB curing system, wherein the curing chamber is configured to cure, freeze, and/or harden an un-patterned and/or a patterned masking layer on the substrate using a curing plasma;
    creating a first plasma at a first plasma potential using a first process gas in a first plasma region, the first plasma region being located in a plasma generation chamber, wherein a plasma generation system is coupled to the plasma generation chamber and provides a first RF power when the first plasma is formed;
    creating the curing plasma in the curing chamber at a curing plasma potential using electron flux from the first plasma region, wherein the electron flux from the first plasma in the first plasma region passes from the plasma generation chamber through a separation member to the curing chamber thereby creating the curing plasma;
    elevating the curing plasma potential above the first plasma potential to control the electron flux;
    maintaining the curing plasma during a first Q-NB curing procedure, wherein pressure in the curing chamber is controlled by pumping the curing chamber and flowing a second process gas into the curing chamber; and
    exposing the deposited layer on the substrate to the curing plasma during the first Q-NB curing procedure.

2. A method for operating a Quasi-Neutral Beam (Q-NB) curing system, comprising:
    positioning a substrate on a substrate holder in a curing chamber in the Q-NB curing system;
    creating a quasi-neutral beam in the curing chamber in the Q-NB curing system, wherein the curing chamber is configured to cure, freeze, and/or harden a deposited masking layer on the substrate using the quasi-neutral beam;
    exposing the deposited masking layer on the substrate to the quasi-neutral beam during a first quasi-neutral beam curing procedure;
    determining a curing state for the substrate;
    performing at least one etching procedure when the curing state is equal to a first value; and
    performing at least one corrective action when the curing state is not equal to the first value.

* * * * *